(12) United States Patent
Hamade et al.

(10) Patent No.: US 6,449,198 B1
(45) Date of Patent: Sep. 10, 2002

(54) SEMICONDUCTOR MEMORY DEVICE

(75) Inventors: Kei Hamade; Takeshi Hamamoto; Masaru Haraguchi; Yasuhiro Konishi, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/717,375

(22) Filed: Nov. 22, 2000

(30) Foreign Application Priority Data

Nov. 29, 1999 (JP) ............................................ 11-338294

(51) Int. Cl.[7] ................................................ G11C 7/00
(52) U.S. Cl. ..................... 365/198; 365/189.01; 365/63; 365/230.01; 365/230.03; 365/230.06; 365/202
(58) Field of Search ............................. 365/189.01, 63, 365/230.01, 230.03, 230.06, 202, 198

(56) References Cited

U.S. PATENT DOCUMENTS 4,868,823 A * 9/1989 White, Jr. et al. ......... 371/21.3
5,270,977 A * 12/1993 Iwamoto et al. ............. 365/201
5,539,700 A * 7/1996 Kawahara et al. .......... 365/203
6,061,288 A * 5/2000 Sekiya ....................... 365/205

FOREIGN PATENT DOCUMENTS

| JP | 5-89685 | 4/1993 |
| JP | 5-159575 | 6/1993 |

* cited by examiner

Primary Examiner—Viet Q. Nguyen
(74) Attorney, Agent, or Firm—McDermott, Will & Emery

(57) ABSTRACT

In the SDRAM, a selector selects one of four global IO line pairs according to a column block select signal and a word configuration selecting signal, and connects the selected global IO line pair to an input/output node pair of a preamplifier in a pulsed manner for a prescribed period of time. Since the equalization of the global IO line pair can be started immediately after the global IO line pair is connected in a pulsed manner to the input/output node pair of the preamplifier, longer equalization period for the global IO line can be set aside so that the read operation can be stabilized.

6 Claims, 27 Drawing Sheets

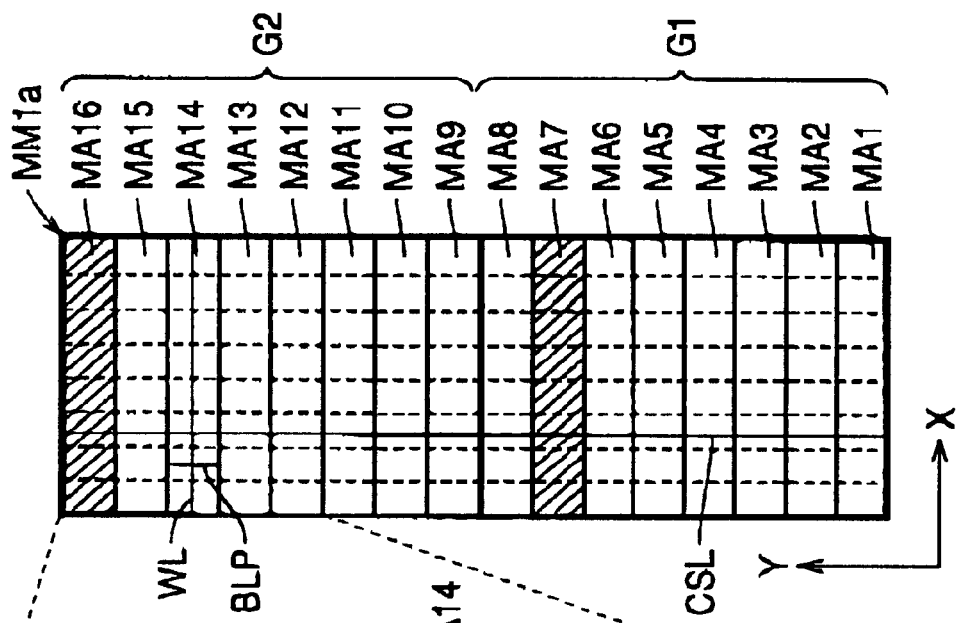
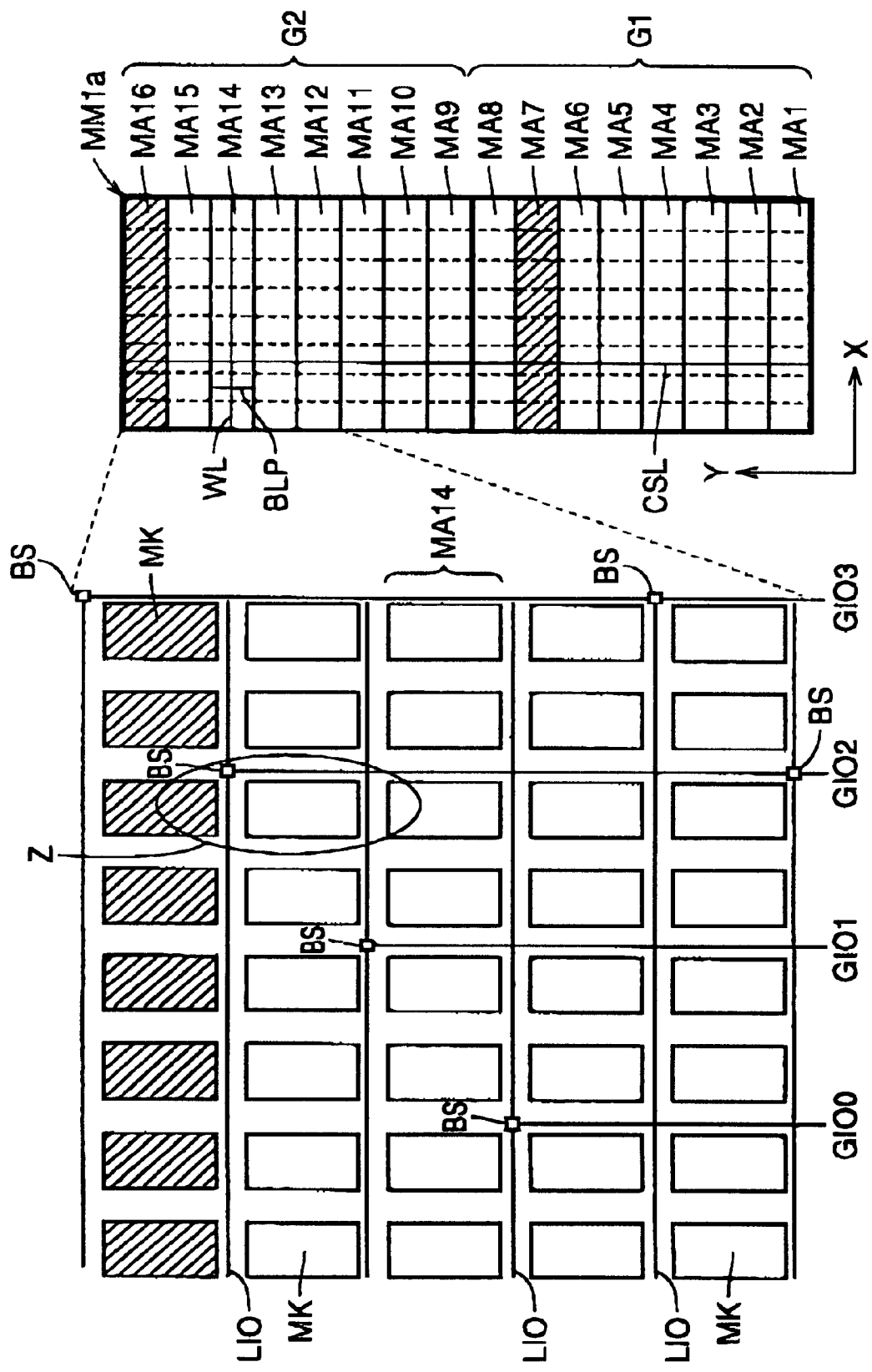

FIG.11A CSL
FIG.11B GIO
FIG.11C CBS0-3
FIG.11D PACM
FIG.11E PAEL
FIG.11F ZPADT
FIG.11G PAE
FIG.11H ZPAEQ
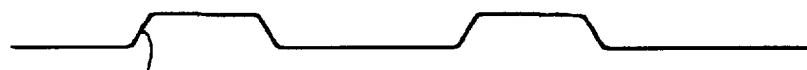
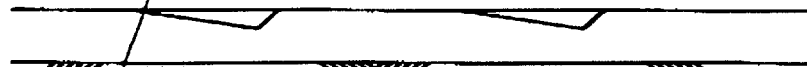
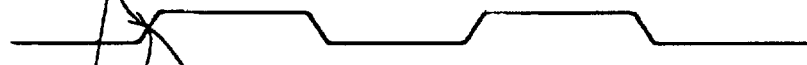
TIME t →

SEMICONDUCTOR MEMORY DEVICE

BACKGROUND OF THE INVENTION

1. Field of the Invention

The present invention relates to a semiconductor memory device, and more specifically, to a semiconductor memory device provided with a plurality of memory cells and data transmission line pairs.

2. Description of the Background Art

Conventionally, a synchronous DRAM (hereinafter referred to as SDRAM) can select one of the three word configurations: x4, x8, and x16. These x4, x8, and x16 word configurations respectively allow simultaneous inputting/outputting of 4 bits of data, 8 bits of data, and 16 bits of data.

In addition, an SDRAM allows the so-called multi-bit test (hereinafter referred to as MBT) that permits the reduction in the testing time and an increase in the number of chips tested at the same time. With MBT, a plurality of memory cells (for instance, four memory cells) can be tested for normalcy via one data input/output pin.

FIG. 24 is a block diagram showing a main portion of such an SRAM. In FIG. 24, SDRAM includes data buses DB0 to DB3 and DB6, selectors 151a to 151d, write data amplifiers (hereinafter referred to as WD amplifiers) 152a to 152d, write buffers 153a to 153d, and global IO line pairs GIO0 to GIO3.

Selectors 151a to 151d connect data bus DB2 to WD amplifiers 152a to 152d during a write operation in x4 configuration, and connect data bus DB0 to WD amplifiers 152a and 152b and connect data bus DB2 to WD amplifiers 152c and 152d during a write operation in x8 configuration. Moreover, selectors 151a to 151d connect data buses DB0 to DB3 respectively to WD amplifiers 152a to 152d during a write operation in x16 configuration, and connect data bus DB2 to WD amplifiers 152b and 152d and connect data bus DB6 to WD amplifiers 152a and 152c during MBT.

WD amplifiers 152a to 152d are respectively activated in response to signals CBS0 to CBS3 attaining the logic high or "H" level or the active level, amplify the data provided from outside via data buses DB0 to DB3 and DB6, and apply the amplified data to write buffers 153a to 153d. Write buffers 153a to 153d respectively transmit the data provided from WD amplifiers 152a to 152d to global IO line pairs GIO0 to GIO3.

During a write operation in x4 configuration, one of signals CBS0 to CBS3 (for instance, CBS0) attains the "H" level or the active level, and the data provided to data bus DB2 from outside is transmitted to global IO line pair GIO0 via selector 151a, WD amplifier 152a, and write buffer 153a. The data transmitted to global IO line pair GIO0 is written into a selected memory cell.

During a write operation in x8 configuration, one of signals CBS0 and CBS1 (for instance, CBS0) and one of signals CBS2 and CBS3 (for instance, CBS2) attain the "H" level or the active level, and the data provided to data bus DB0 from outside is transmitted to global IO line pair GIO0 via selector 151a, WD amplifier 152a, and write buffer 153a, while the data provided to data bus DB2 from outside is transmitted to global IO line pair GIO2 via selector 151c, WD amplifier 152c, and write buffer 153c. The data transmitted to global IO line pairs GIO0 and GIO2 are respectively written into the two selected memory cells.

During a write operation in x16 configuration, signals CBS0 to CBS3 all attain the "H" level or the active level, and the data provided to data buses DB0 to DB3 from outside are transmitted to global IO line pairs GIO0 to GIO3 via selectors 151a to 151d, WD amplifiers 152a to 152d, and write buffers 153a to 153d, respectively. The data transmitted to global IO line pairs GIO0 to GIO3 are respectively written into the four selected memory cells.

During a write operation in MBT, signals CBS0 to CBS3 all attain the "H" level or the active level, and the data provided to data bus DB2 from outside is transmitted to global IO line pairs GIO1 and GIO3 via selectors 151b and 151d, WD amplifiers 152b and 152d, and write buffers 153b and 153d, while the data provided to data bus DB6 from outside is transmitted to global IO line pairs GIO0 and GIO2 via selector 151a and 151c, WD amplifiers 152a and 152c, and write buffers 153a and 153c. The data transmitted to global IO line pairs GIO0 to GIO3 are respectively written into the four selected memory cells.

In addition, the SDRAM includes preamplifiers 154a to 154d, a CAS latency shifters (hereinafter referred to as CL shifters) 155a to 155d, selectors 156a to 156d and 158a to 158d, and read data buffers (hereinafter referred to as RD buffers) 157a to 157d.

Preamplifiers 154a to 154d are respectively activated in response to signals PAE0 to PAE3 attaining the "H" level or the active level, and amplify the data signals read out to global IO line pairs GIO0 to GIO3. CL shifters 155a to 155d respectively delay the output signals from preamplifiers 154a to 154d by one clock cycle.

During a read operation in x4 configuration, selectors 156a to 156d apply to RD buffer 157c the data provided via CL shifter 155a from one preamplifier (for instance 154a) of preamplifiers 154a to 154d selected by signals PAE0 to PAE3. During a read operation in x8 configuration, selectors 156a to 156d apply to RD buffer 157a the data provided via CL shifter 155a from one preamplifier (for instance 154a) of preamplifiers 154a and 154b selected by signals PAE0 and PAE1, and apply to RD buffers 157c to the data provided via CL shifter 155c from one preamplifier (for instance 154c) of preamplifiers 154c and 154d selected by signals PAE2 and PAE3. During the read operations in x16 configuration and in MBT, selectors 156a to 156d respectively apply to RD buffers 157a to 155d the data provided via CL shifters 155a to 155d from preamplifiers 154a to 154d.

Selectors 158a to 158d couple RD buffers 157a to 157d to data buses DB0 to DB3 during a normal read operation, and couple RD buffers 157a to 157d respectively to data buses DB6, DB2, DB6, and DB2 during a read operation in MBT.

RD buffers 157a to 157d respectively drive data buses DB0 to DB3 according to data provided from selectors 156a to 156d during a normal read operation, respectively drive data buses DB6, DB2, DB6, and DB2 during a read operation in MBT.

During the read operation in x4 configuration, one of signals PAE0 to PAE3 (for instance, signal PAE0) attains the "H" level or the active level, and the data read out on a global IO line pair (in this case, GIO0) is transmitted to data bus DB2 via preamplifier 154a, CL shifter 155a, selector 156c, RD buffer 157c, and selector 158c. The data transmitted to data bus DB2 is output to the outside.

During the read operation in x8 configuration, one of signals PAE0 and PAE1 (for instance, PAE0) attains the "H" level or the active level, and the data read out on a global IO line pair (in this case, GIO0) is transmitted to data bus DB0 via preamplifier 154a, CL shifter 155a, selector 156a, RD buffer 157a, and selector 158a, and one of signals PAE2 and PAE3 (for instance, PAE2) attains the "H" level or the active level, and the data read out on a global IO line pair (in this case, GIO2) is transmitted to data bus DB2 via preamplifier 154c, CL shifter 155c, selector 156c, RD buffer 157c, and selector 158c. The data transmitted to data buses DB0 and DB2 are output to the outside.

During the read operation in x16 configuration, signals PAE0 to PAE3 all attain the "H" level or the active level, and the data read out on global IO line pairs GIO0 to GIO3 are respectively transmitted to data buses DB0 to DB3 via preamplifiers 154a to 154d, CL shifters 155a to 155d, selectors 156a to 156d, RD buffers 157a to 157d, and selectors 158a to 158d. The data transmitted to data buses DB0 to DB3 are output to the outside.

During the read operation in MBT, signals PAE0 to PAE3 all attain the "H" level or the active level, and the data read out on global IO line pairs GIO0 to GIO3 are respectively transmitted to data buses DB6, DB2, DB6, DB2 via preamplifiers 154a to 154d, CL shifters 155a to 155d, selectors 156a to 156d, RD buffers 157a to 157d, and selectors 158a to 158d. The data transmitted to data buses DB0 to DB3 are output to the outside. When the 2 bits of data read out on data bus DB6 match, the two memory cells are determined as being normal, and when no match occurs, the memory cells are determined as being defective. When the 2 bits of data read out on data bus DB2 match, the two memory cells are determined as being normal, and when no match occurs, the memory cells are determined as being defective.

The portion relating to reading of data in the block shown in FIG. 24 will be described in detail below.

Preamplifier 154c includes P-channel MOS transistors 161 to 165 and N-channel MOS transistors 166 to 168 as shown in FIG. 25. Input/output nodes N161 and N162 in preamplifier 154c are respectively connected to global IO lines GIOL2 and /GIOL2. P-channel MOS transistors 161 and 162 are connected in series between nodes N161 and N162, and receive signal ZPAEQ at their respective gates. P-channel MOS transistors 161 and 162 form an equalizer. When signal ZPAEQ attains the "L" level or the active level, P-channel MOS transistors 161 and 162 are rendered conductive, and nodes N161 and N162 are equalized to the "H" level.

P-channel MOS transistor 163 is connected between a power-supply potential VCC line and a node N163. P-channel MOS transistor 164 is connected between node N163 and node N161, and P-channel MOS transistor 165 is connected between node N163 and node N162, respectively. N-channel MOS transistor 166 is connected between node N161 and node N168 and N-channel MOS transistor 167 is connected between node N162 and node N168, respectively. P-channel MOS transistor 168 is connected between node N168 and a ground potential VSS line. Gates of MOS transistors 163 and 168 receive signals ZPAE2 and PAE2, respectively. Gates of MOS transistor transistors 164 and 166 are both connected to node N162, and gates of MOS transistors 165 and 167 are both connected to node N161. MOS transistors 163 to 168 form a differential amplifier. This differential amplifier is activated in response to signals ZPAE2 and PAE2 respectively attaining the "L" level and the "H" level, causing either node N161 or node N162 having the higher potential to attain the "H" level while causing the other node to attain the "L" level. Signals appearing on nodes N161 and N162 become output signals PDCL and /PDCL from preamplifier 154c.

During a read operation, signal ZPAEQ rises to the "H" level or the inactive level, rendering P-channel MOS transistors 161 and 162 non-conductive, and thus the equalization of nodes N161 and N162 is interrupted. Thereafter, data is read from a selected memory cell, and slight potential difference is created between global IO lines GIOL2 and /GIOL2 according to the data. Then, signals PAE and ZPAE respectively attain the "H" level and the "L" level, activating the differential amplifier formed by MOS transistors 163 to 168 so that, of global IO lines GIOL2 and /GIOL2, the one having the higher potential is brought to the "H" level (power-supply potential VCC), and the one having the lower potential is brought to the "L" level (ground potential VSS).

Other preamplifiers 154a, 154b, and 154d have the same configuration as the configuration of preamplifier 154c. Preamplifiers 154a, 154b, and 154d, however, are provided with signals PAE0 and ZPAE0, signals PAE1 and ZPAE1, and signals PAE3 and ZPAE3, respectively, instead of signals PAE2 and ZPAE2.

Preamplifier activating signals PAE0 to PAE3 are generated based on a preamplifier activating master signal PACM and column block decode signals CBS0 to CBS3, as shown in FIG. 26.

CL shifter 155c includes a master latch circuit 169 and a slave latch circuit 170, as shown in FIG. 25. Latch circuit 169 and 170 invert output signals PDCL and /PDCL from preamplifier 154c and output the inverted signals with a delay of one clock cycle. Output signals PD2 and ZPD2 from slave latch circuit 170 are applied to selector 156c. Other CL shifters 155a, 155b, and 155d have the same configuration as CL shifter 155c.

Selector 156c includes P-channel MOS transistors 175 and 176, N-channel MOS transistors 181 to 188, and N-channel MOS transistors 191 to 198, as shown in FIG. 27. P-channel MOS transistor 175 is connected between a power-supply potential VCC line and an output node N175 and P-channel MOS transistor 176 is connected between power-supply potential VCC line and an output node N176, respectively. P-channel MOS transistor 175 and 176 receive a signal RDRVM at their respective gates. N-channel MOS transistors 181 and 182, N-channel MOS transistors 183 and 184, N-channel MOS transistors 185 and 186, and N-channel MOS transistors 187 and 188 are respectively connected in series between node N175 and a ground potential VSS line. N-channel MOS transistors 191 and 192, N-channel MOS transistors 193 and 194, N-channel MOS transistors 195 and 196, and N-channel MOS transistors 197 and 198 are respectively connected in series between node N176 and ground potential VSS line.

Gates of N-channel MOS transistors 181, 183, 185, and 187 respectively receive signals PD0 to PD3, and gates of N-channel MOS transistors 191, 193, 195, and 197 respectively receive signals ZPD0 to ZPD3. Gates of N-channel MOS transistors 182, 184, 192, and 194 all receive a signal RDRV4. Gates of N-channel MOS transistors 186 and 196 both receive a signal RDRV4816. Gates of N-channel MOS transistors 188 and 198 both receive a signal RDRV48. Signals that appear on nodes N175 and N176 become signals ZDRV and ZZDRV, respectively.

Signal RDRV4 attain the "H" level or the active level during the read operation in x4 configuration. Signal RDRV48 attains the "H" level or the active level during the read operations in x4 configuration and x8 configuration. Signal RDRV4816 attain the "H" level or the active level during the read operations in x4 configuration, x8 configuration, x16 configuration, and MBT.

During the read operation in x4 configuration, signal RDRVM first attain the "L" level for a prescribed period of time, rendering P-channel MOS transistors 175 and 176 conductive for the prescribed period of time, and nodes N175 and N176 are precharged to the "H" level. Thereafter, signals RDRV4, RDRV48, RDRV4816 attain the "H" level or the active level, rendering N-channel MOS transistors 182, 184, 186, 188, 192, 194, 196, and 198 conductive, while one of signals PD0 to PD3 and ZPD0 to ZPD3 (for instance, PD3) attains the "H" level, rendering an N-channel MOS transistor (in this case, 187) conductive, and thus node N175 attains the "L" level.

During the read operation in x8 configuration, after nodes N175 and N176 are precharged to the "H" level, signals RDRV48 and RDRV4816 attain the "H" level or the active level, rendering N-channel MOS transistors 186, 188, 196, and 198 conductive, while one of signals PD2, PD3, ZPD2, and ZPD3 (for instance, PD2) attains the "H" level, rendering an N-channel MOS transistor (in this case, 185) conductive, and thus node N175 attains the "L" level.

During the read operation in x16 configuration and MBT, after nodes N175 and N176 are precharged to the "H" level, signal RDRV4816 attains the "H" level or the active level, rendering N-channel MOS transistors 186 and 196 conductive, while one of signals PD2 and ZPD2 (for instance, PD2) attains the "H" level, rendering an N-channel MOS transistor (in this case, 185) conductive, and thus node N175 attains the "L" level.

Signals RDRV4, RDRV48, RDRV4816 are generated by NAND gates 201 to 203 and inverters 204 to 206 based on signal RDRVM and word configuration selecting signals Mx4, Mx48, and Mx4816, as shown in FIG. 28. Thus, NAND gate 201 receives signals RDRVM and Mx4, and the output signal from NAND gate 201 is inverted by inverter 204 and becomes signal RDRV4. NAND gate 202 receives signals RDRVM and Mx48, and the output signal from NAND gate 202 is inverted by inverter 205 and becomes signal RDRV48. NAND gate 203 receives signals RDRVM and Mx4816, and the output signal from NAND gate 203 is inverted by inverter 206 and becomes signal RDRV4816. Signal Mx4 attains the "H" level in x4 configuration. Signal Mx48 attains the "H" level in x4 configuration and x8 configuration. Signal Mx4816 attains the "H" level in x4 configuration, x8 configuration, and x16 configuration.

Other selectors 156a, 156b, and 156d have the same configuration as the configuration of selector 156c. Signal RDRV816 instead of signal RDRV4, however, is input to gates of N-channel MOB transistors 182 and 192, and signal RDRV8 instead of signal RDRV4 is input to gates of N-channel MOS transistors 184 and 194, and the gates of N-channel MOS transistors 186, 188, 196, and 198 are grounded. Signal RDRV816 attains the "H" level or the active level during the read operations in x8 configuration, x16 configuration, while signal RDRV8 attains the "H" level or the active level during the read operations in x8 configuration and MBT.

In selector 156b, signal RDRV16 instead of signal RDRV4 is input to the gates of N-channel MOS transistors 184 and 194, and the gates of N-channel MOS transistors 182, 186, 188, 192, 196, and 198 are grounded. Signal RDRV16 attains the "H" level or the active level during the read operations in x16 configuration and MBT. In selector 156d, signal RDRV16 instead of signal RDRV48 is input to the gates of N-channel MOS transistors 188 and 198, and the gates of N-channel MOS transistors 182, 184, 186, 192, 194, and 196 are grounded.

RD buffer 157c includes inverters 211 to 214, NOR gates 215 and 216, P-channel MOS transistors 217 and 218, and N-channel MOS transistors 219 and 220, as shown in FIG. 29. It is assumed that RD buffer 157c is connected to data bus DB2 by selector 158c.

P-channel MOS transistors 217 and 218 are connected between a power-supply potential VCC line and data bus lines DBL2 and /DBL2, respectively, and receive signals ZDRV and ZZDRV from selector 156c respectively at their gates. N-channel MOS transistors 219 and 220 are connected between a ground potential VSS line and data bus lines DBL2 and /DBL2, respectively. NOR gate 215 receives signals TE and ZZDRV, and an output signal $\phi$215 from NOR gate 215 is input to a gate of N-channel MOS transistor 219. NOR gate 216 receives signals TE and ZDRV, and an output signal $\phi$216 from NOR gate 216 is input to a gate of N-channel MOS transistor 220. Inverters 211 and 212 form a latch circuit which latches the level of signal ZDRV. Inverters 211 and 212 form a latch circuit which latches the level of signal ZZDRV. Other RD buffers 157a, 157b, 157d have the same configuration as RD buffer 157c.

FIG. 30 is a circuit diagram showing an equalizer 221 provided to a data bus DB2. In FIG. 30, equalizer 221 includes N-channel MOS transistors 222 to 224. N-channel MOS transistors 222 and 223 are connected between data bus lines DBL2 and /DBL2 and a ground potential VSS line, respectively, and N-channel MOS transistor 224 is connected between data bus lines DBL2 and /DBL2. N-channel MOS transistor 222 to 224 receive a signal DBEQ at their gates. When signal DBEQ attains the "H" level or the active level, N-channel MOS transistors 222 to 224 are rendered conductive, and data bus lines DBL2 and /DBL2 are equalized to the "L" level (ground potential VSS). Equalizer 221 is provided to each of data buses DB0 to DB3 and DB6.

FIG. 31 is a timing chart illustrating the normal read operations of RD buffer 157c shown in FIG. 29 and equalizer 221 shown in FIG. 30. As shown in FIG. 31, signal TE is fixed to the "L" level during a normal read operation. Thus, NOR gates 215 and 216 respectively operate as inverters for signals ZZDRV and ZDRV. In the initial state, signals ZDRV and ZZDRV are at the "H" level, and MOS transistors 217 to 220 are all rendered non-conductive. Moreover, the equalization is complete and N-channel MOS transistors 222 to 224 are non-conductive, and data bus lines DBL2 and /DBL2 are both at the "L" level and in the high impedance state.

At a point in time, when the data is read out from a memory cell, and signal ZDRV attains the "L" level, for instance, MOS transistors 217 and 220 are rendered conductive, and data bus lines DBL2 and /DBL2 respectively attain the "H" level and the "L" level. The potentials of data bus lines DBL2 and /DBL2 are compared, and a signal of the level corresponding to the result of the comparison is output as read data to the outside.

FIG. 32 is a timing chart illustrating the read operations in MBT of RD buffer 157c shown in FIG. 29 and equalizer 221 shown in FIG. 30. In MBT, RD buffer 157c is connected to data bus DB6 by selector 158c. As shown in FIG. 32, signal TE is fixed to the "H" level during MBT. Thus, output signals $\phi$215 and $\phi$216 from NOR gates 215 and 216 attain the "L" level, and N-channel MOS transistors 219 and 220 are fixed in the non-conductive state. In the initial state, signals ZDRV and ZZDRV are at the "H" level, and P-channel MOS transistors 217 and 218 are rendered non-conductive. Moreover, the equalization is complete and N-channel MOS transistors 222 to 224 are non-conductive, and data bus lines DBL6 and /DBL6 are both at the "L" level and in the high impedance state.

At a point in time, when the data is read out from a memory cell, and signal ZDRV attains the "L" level, for instance, MOS transistor 217 alone among MOS transistors 217 and 220 is rendered conductive, and data bus line DBL6 attains the "L" level. Data bus line /DBL6 remains unchanged at the "L" level and in the high impedance state. At this time, data bus DB6 is driven also by RD buffer 157a. During a write operation in MBT, same data is written into two memory cells from data bus DB6 via selector 151a and 151c, WD amplifiers 152a and 152c, write buffers 153a and 153c, and global IO line pairs GIO0 and GIO2.

During the read operation in MBT, if two memory cells are normal, the same data is read out on global IO line pairs GIO0 and GIO2, and only one of data bus lines DBL6 and /DBL6 (for instance, DBL6) is brought to the "H" level. If one of the two memory cell is defective, however, different data are read out on global IO line pairs GIO0 and GIO2, and both data bus lines DBL6 and /DBL6 are brought to the "H" level. Thus, the normalcy of two memory cells can be determined from the comparison of the levels of data bus lines DBL6 and /DBL6, and a signal of the level corresponding to the result of the determination is output to the outside.

A conventional SDRAM configured in the above-described manner has a problem that, since global IO line pairs GIO0 to GIO3 are directly connected to input/output nodes N161 and N162 of preamplifiers 154a to 154d, the equalization of global IO line pairs GIO0 to GIO3 becomes insufficient causing the read operation to become unstable when a high-speed operation is attempted.

In addition, a conventional SDRAM has a problem of complicated layout and a large layout area since selectors 156a to 156d are provided between CL shifters 155a to 155d and RD buffers 157a to 157d.

Moreover, there is a problem of large current consumption since each of data bus lines DBL and /DBL are driven to a power-supply potential VCC or a ground potential VSS.

SUMMARY OF THE INVENTION

Thus, the main object of the present invention is to provide a semiconductor memory device capable of a stable read operation and requiring small layout area and small current consumption.

According to one aspect of the present invention, a switching element pair connected between the other end of a data transmission line pair and an input/output node pair of a preamplifier and rendered conductive in a pulsed manner for a prescribed period of time to provide a potential difference produced between the data transmission line pair to the input/output node pair of the preamplifier is provided. Since the equalization of the data transmission line pair can be started immediately after the switching element pair is rendered conductive in a pulsed manner, longer equalization period can be set aside for the data transmission line pair having a large capacity so that the read operation can be stabilized.

Preferably, a first equalizer for equalizing potentials of the data transmission pair to a prescribed precharge potential during a first equalization period after the switching element pair is rendered conductive in a pulsed manner and a second equalizer for equalizing potentials of the input/output node pair of the preamplifier to the prescribed precharge potential during a second equalization period before the switching element pair is rendered conductive in a pulsed manner are further provided. Thus, the equalization of the data transmission line pair and the equalization of the input/output node pair of the preamplifier can be effected separately.

Preferably, the memory array and the data transmission line pair are provided in plurality, and a selecting circuit for selecting one of a plurality of the data transmission line pairs according to an address signal and for rendering conductive in a pulsed manner a switching element pair corresponding to the selected data transmission line for the above prescribed period of time is provided. In this case, of the plurality of data transmission line pairs, only the data transmission line pair designated by the address signal is connected in a pulsed manner to an input/output node pair of a preamplifier.

Preferably, a first equalizer for equalizing potentials of each data transmission pair to a prescribed precharge potential during a first equalization period after the other end of the data transmission line and the input/output node pair of the preamplifier are connected in a pulsed manner and a second equalizer for equalizing potentials of the input/output node pair of the preamplifier to the prescribed precharge potential during a second equalization period before the other end of the data transmission line and the input/output node pair of the preamplifier are connected in a pulsed manner are further provided. Thus, the equalization of each data transmission line pair and the equalization of the input/output node pair of the preamplifier can be effected separately.

According to another aspect of the present invention, selectors for respectively connecting other ends of N data transmission line pairs with input/output node pairs of N preamplifiers in a first read mode and for selecting M data transmission line pairs out of N data transmission line pairs according to an address signal and connecting other ends of selected M data transmission line pairs respectively to input/output node pairs of pre-selected M preamplifiers in a second read mode are provided. Thus, the layout can be simplified and the layout area can be reduced in comparison with the conventional example in which the selectors are provided between N preamplifiers and N transmission circuits.

Preferably, a determination circuit for determining in a test mode whether output data signals of N preamplifiers match in logic, and for outputting a signal indicating the normalcy of the selected N memory cells when a match occurs and outputting a signal indicating at least one memory cell of the selected N memory cells as being defective when no match occurs is further provided. In this case, N memory cells can be tested for normalcy at the same time.

According to a further aspect of the present invention, a first drive circuit for providing in a pulsed manner for a prescribed period of time a first potential and a second potential respectively to one end of a first data transmission line and to one end of a second data transmission line contained in a data transmission line pair to bring the first and second data transmission lines respectively to a third potential and a fourth potential between the first and second potentials when the data read by a read circuit is of a first logic, and for providing in a pulsed manner for said prescribed period of time the second and first potentials respectively to one end of the first data transmission line and to one end of the second data transmission line to bring the first and second data transmission lines respectively to the fourth and third potentials when the data read by the read circuit is of a second logic is provided. Thus, the consumed current can be kept small in comparison with the conventional example in which each of the first and second data transmission lines is brought to the first potential or the second potential.

Preferably, the first drive circuit includes a delay circuit having a plurality of inverters which are connected in series and each of which is driven by a power-supply voltage, and the above prescribed period of time is the time period required from the time when a signal synchronized to a read operation of the read circuit is input to the delay circuit to the time when the signal is output from the delay circuit. In this case, when the power-supply potential is lowered, the delay time of the delay circuit is increased and the charging/discharging time of the data transmission lines becomes longer so that the potential amplitudes of the first and second data transmission lines are kept from becoming smaller due to the lowering of the power-supply potential.

Preferably, an equalizer for equalizing potentials of the first and second data transmission lines to a prescribed precharge potential between the first and second potentials during an equalization period before the first and second potentials are provided to the first and second data transmission lines is further provided. In this case, the read operation can be stabilized.

Preferably, the equalizer includes a diode element, and a connecting circuit for connecting the diode element between the first and second data transmission lines and a line having the second potential during the equalization period. In this case, a precharging power source is not required so that the configuration can be simplified.

Preferably, the equalizer is provided in plurality, and the plurality of equalizers are scatteringly provided in a direction in which the first and second data transmission lines extend. In this case, a high-speed equalization of the first and second data transmission lines can be achieved.

Preferably, a sub-equalizer for connecting the first data transmission line and the second data transmission line during the equalization period is further provided. In this case, the equalization of the first and second data transmission lines can be achieved at a higher speed.

Preferably, the sub-equalizer is provided in plurality, and the plurality of sub-equalizers are scatteringly provided in a direction in which the first and second data transmission lines extend. In this case, the equalization of the first and second data transmission lines can be achieved at an even higher speed.

Preferably, a control circuit for activating all of the plurality of sub-equalizers in the test mode and for activating only a pre-selected sub-equalizer of the plurality of sub-equalizers during a normal operation is further provided. In this case, the equalization period for the normal operation and for the test mode can be made the same.

Preferably, a second drive circuit activated in the test mode, for causing the first data transmission line to attain the first potential when data read out by the read circuit is of a first logic and for causing the second data transmission line to attain the first potential when the data is of a second logic, and a determination circuit for determining the normalcy of a selected memory cell, based on potentials of the first and second data transmission lines are further provided. In this case, each of the first and second data transmission lines are brought to the precharge potential or the first potential so that the testing operation can be stabilized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A and 3B are diagrams illustrating the configuration of a memory mat MM1$a$ shown in FIG. 2.

FIGS. 11A to 11H are timing charts illustrating the operations of the selector shown in FIG. 9 and the preamplifier shown in FIG. 10.

DESCRIPTION OF THE PREFERRED EMBODIMENTS

Figure 1:
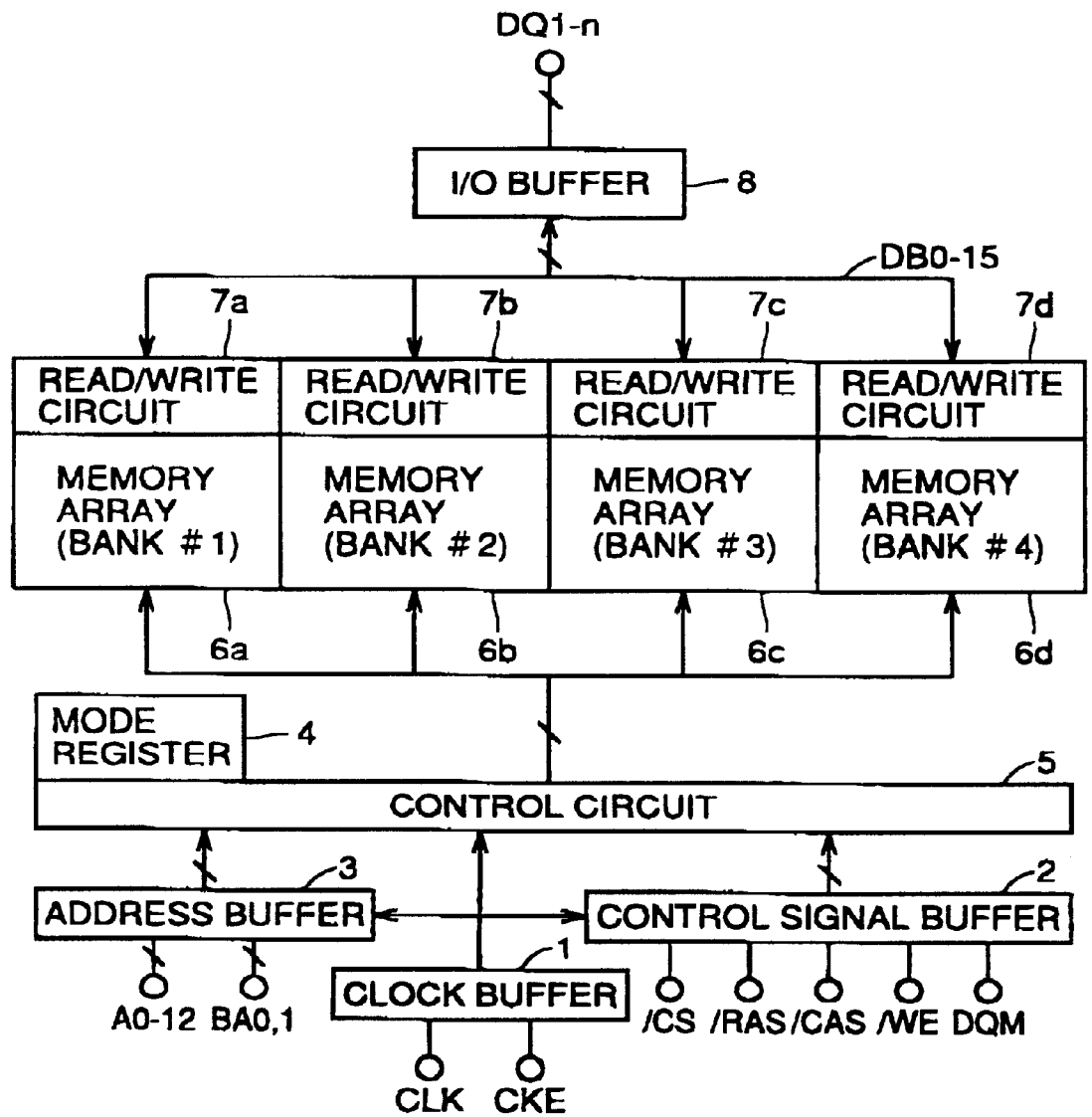
FIG. 1 is a block diagram showing the schematic configuration of an SDRAM according to one embodiment of the present invention.

FIG. 1 is a block diagram showing the schematic configuration of an SDRAM according to one embodiment of the present invention. In FIG. 1, the SDRAM includes a clock buffer 1, a control signal buffer 2, an address buffer 3, a mode register 4, a control circuit 5, four memory arrays 6a to 6d (banks #1 to #4), four read/write circuits 7a to 7d, and an I/O buffer 8.

Clock buffer 1 is activated by an external control signal CKE, and transmits an external clock signal CLK to control signal buffer 2, address buffer 3, and control circuit 5. Control signal buffer 2 latches external control signals /CS, /RAS, /CAS, /WE, and DQM in synchronism with external clock signal CLK from dock buffer 1 and applies the latched signals to control circuit 5. Address buffer 3 latches external address signals A0 to A12 and bank selecting signals BA0 and BA1 in synchronism with external clock signal CLK from clock buffer 1 and applies the latched signals to control circuit 5.

Mode register 4 stores the mode designated by external address signals A0 to A12 and outputs an internal command signal corresponding to that mode. Each of memory arrays 6a to 6d includes a plurality of memory cells disposed in a matrix of rows and columns, and each memory cell stores one bit of data. The plurality of memory cells are divided into groups of n memory cells in advance (where n is a number pre-selected from the numbers 4, 8, and 16).

Control circuit 5 generates a variety of internal signals according to signals from clock buffer 1, control signal buffer 2, address buffer 3, and mode register 4, and controls the entire SDRAM. During a read operation and during a write operation, control circuit 5 selects one of four memory arrays 6a to 6d according to bank selecting signals BA0 and BA1, and selects n memory cells from the selected memory array according to address signals A0 to A12.

Read/write circuits 7a to 7d reads data Q1 to Qn from n memory cells selected by control circuit 5 during a read operation, and writes data D1 to Dn into n memory cells selected by control circuit 5 during a write operation. Read/write circuits 7a to 7d are coupled to I/O buffer 8 via data buses DB0 to DB15.

I/O buffer 8 outputs read data Q1 to Qn from read/write circuits 7a to 7d outside during the read operation, and applies data D1 to Dn input from outside to read/write circuits 7a to 7d during the write operation.

Figure 2:
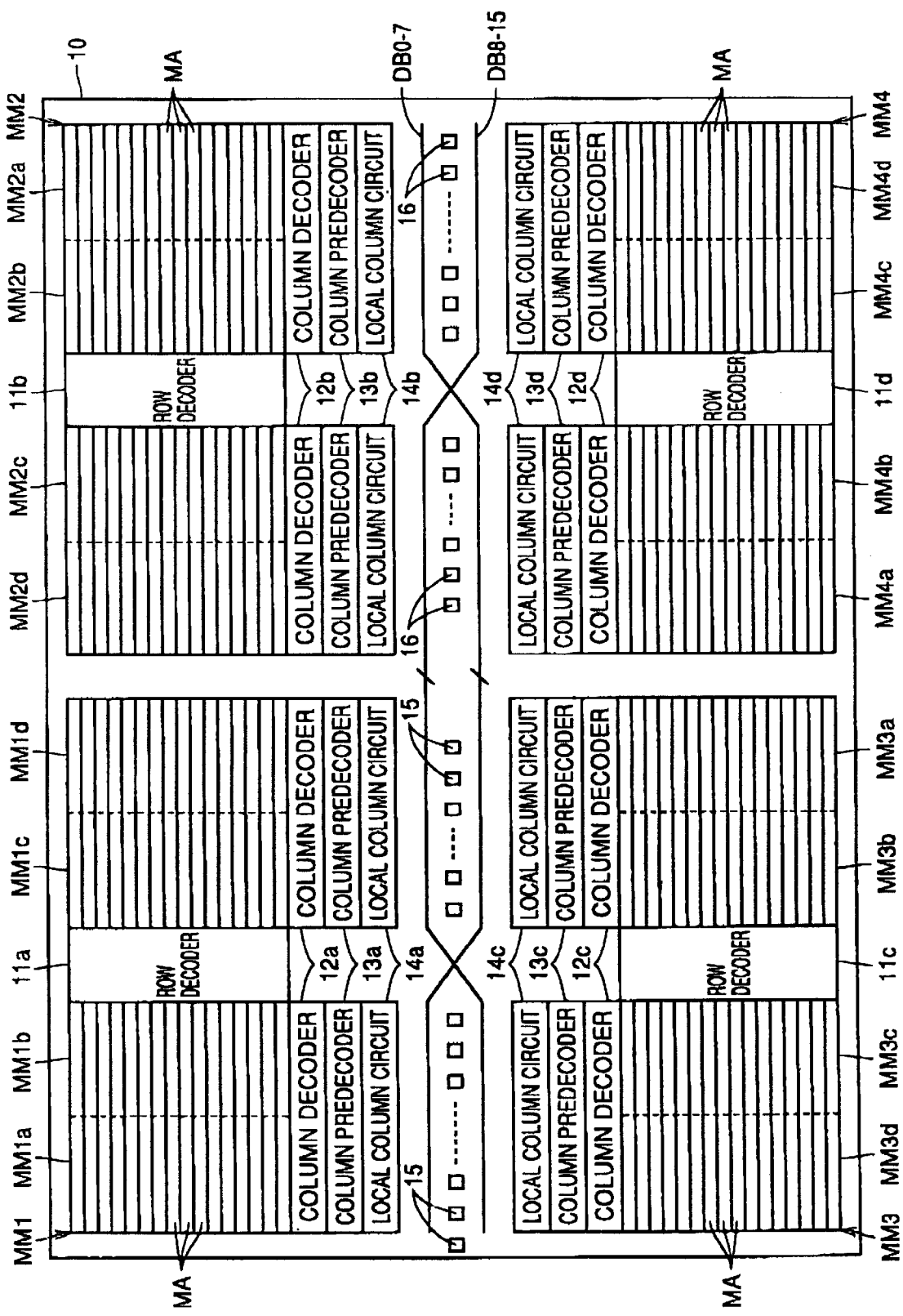
FIG. 2 is a block diagram showing a chip layout of the SDRAM shown in FIG. 1.

FIG. 2 is a diagram showing a chip layout of the SDRAM shown in FIG. 1. In FIG. 2, the SDRAM includes four memory mats MM1 to MM4 respectively disposed in the four corners of a rectangular semiconductor substrate 10. This SDRAM has a storage capacity of 256 Mbits, and each of memory mats MM1 to MM4 has a storage capacity of 64 Mbits. Memory mats MM1 to MM4 are further divided into four memory mats MM1a to MM1d, MM2a to MM2d, MM3a to MM3d, and MM4a to MM4d, respectively, in the direction along the long side of the chip, and row decoders 11a to 11d are respectively disposed between memory mats MM1b and MM1c, MM2b and MM2c, MM3b and MM3c, and MM4b and MM4c.

Moreover, column decoders 12a to 12d, column predecoder 13a to 13d, and local column circuits 14a to 14d are provided in memory mats MM1 to MM4 toward the center of the chip. In the central portion of the chip, a plurality of pads 15 to which signals A0 to A12, BA0, BA1, CLK, CKE, /CS, /RAS, /CAS, /WE, and DQM are input, and a plurality of pads 16 for inputting and outputting of data are aligned in the direction along the long side of the chip. On either side of pads 15 and pads 16 arranged in lines, data buses DB0 to DB7 and data buses DB8 to DB15 are provided. Data buses DB0 to DB7 and data buses DB8 to DB15 are crossed in the central portion to allow data communication with each of memory mat MM1 to MM4.

Memory mats MM1 to MM4 respectively include memory arrays 6a to 6d shown in FIG. 1. Row decoders 11a to 11d, column decoders 12a to 12d, and column predecoders 13a to 13d are contained in control circuit 5 shown in FIG. 1. Moreover, local column circuits 14a to 14d are contained in read/write circuits 7a to 7d shown in FIG. 1.

Memory mat MM1a is divided into sixteen memory arrays MA1 to MA16 in the direction along the short side of the chip (direction Y), and each of memory arrays MA1 to MA16 is divided into eight memory blocks MK in the direction along the long side of the chip (direction X), as shown in FIGS. 3A and 3B. In other words, memory mat MM1a is divided into memory blocks MK of sixteen rows and eight columns. Eight memory arrays MA1 to MA8 close to column decoder 12a form a first memory array group G1, and eight memory arrays MA9 to MA16 far from column decoder 12b form a second memory array group G2.

Each memory array MA includes A plurality of word lines WL extending in the direction X in the diagram and a plurality of bit line pairs BLP extending in the direction Y in the diagram. One end of each word line WL is connected to row decoder 11a. A plurality of column select lines CSL are provided in common to sixteen memory arrays MA1 to MA16, and one end of each column select line CSL is connected to column decoder 12a.

Local IO line pairs LIO are disposed extending in the direction X between and on either side of memory arrays MA1 to MA16, and global IO line pairs GIO0 to GIO3 extending in the direction Y are respectively disposed along memory blocks MK of the even-numbered columns. A block selecting switch BS is provided between each local IO line pairs LIO and one of four global IO line pairs GIO0 to GIO3. A local IO line pair LIO is shared by two adjacent memory arrays MA. Two global IO line pairs GIO are utilized either by memory array group G1 or by memory array group G2.

In memory mat MM1a, one column select line CSL enters the selected state. One column select line CSL selects two bit line pairs BLP in memory array group G2 far from the central portion of the chip to connect the selected two bit line pairs BLP to corresponding local IO line pairs LIO, and selects two bit line pairs BLP in memory array group G1 close to the central portion of the chip to connect the selected two bit line pairs BLP to corresponding local IO line pairs LIO.

In other words, one column select line CSL causes four bit line pairs BLP to enter the selected state and to be connected to four global IO line is pairs GIO via local IO line pairs LIO. When bank #1, that is memory mat MM1, is selected, four bit line pairs BLP are selected in each of memory mats MM1a to MM1d so that the total of sixteen bit line pairs BLP would be selected, thereby allowing simultaneous access to sixteen bits of memory cells in total.

Figure 4:
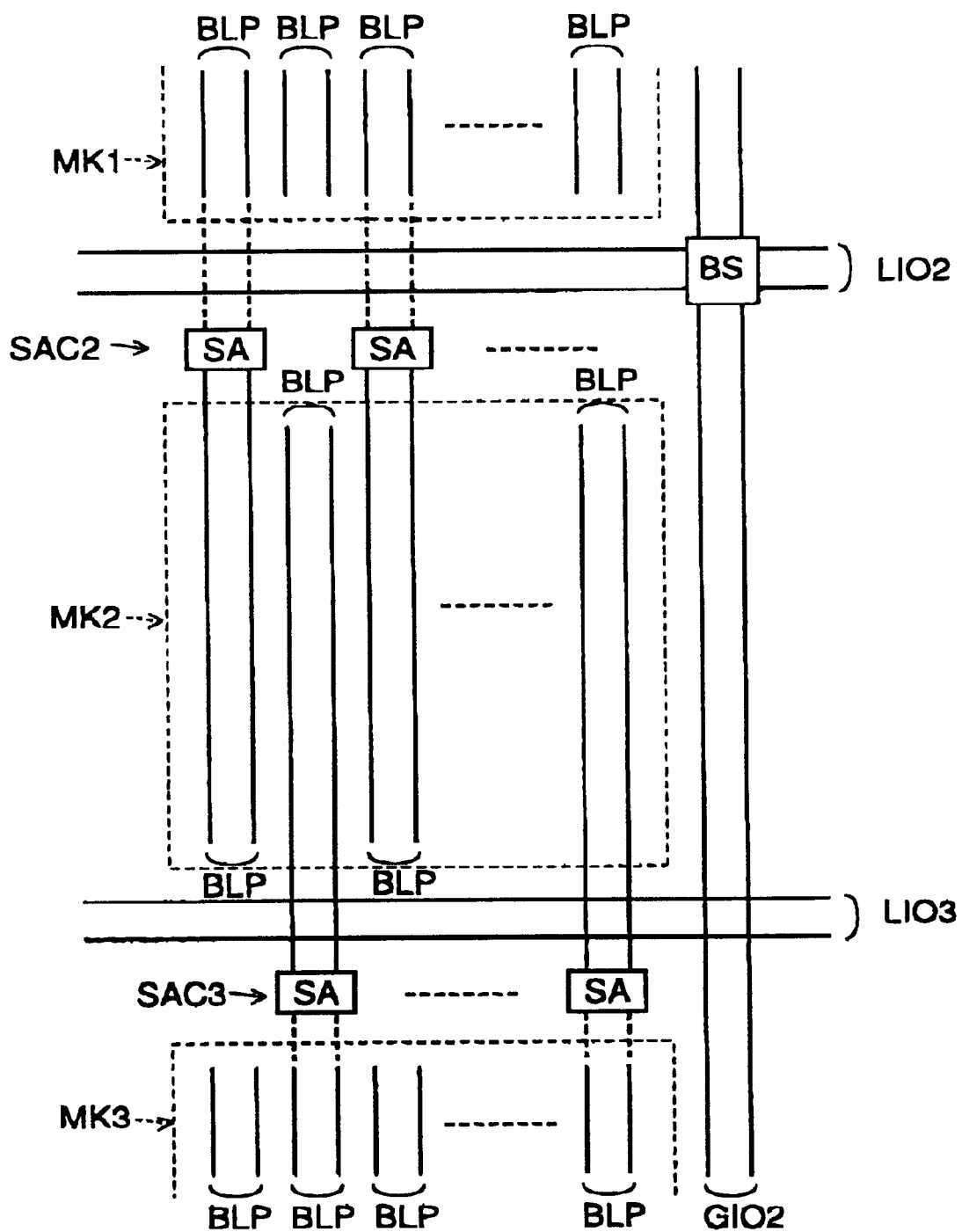
FIG. 4 is an enlarged view of a portion Z shown in FIG. 3A

FIG. 4 is an enlarged view of a portion Z shown in FIG. 3A As shown in FIG. 4, the SDRAM adopts the so-called alternately arranged shared sense amplifier scheme. In other words, a local IO line pair LIO2 and a line of sense amplifiers SAC2 shared by memory blocks MK1 and MK2 are provided in the region between memory blocks MK1 and MK2. A sense amplifier SA from line of sense amplifiers SAC2 is correspondingly provided, for instance, to even-numbered bit line pairs BLP of memory blocks MK1 and MK2.

In addition, a local IO line pair LIO3 and a line of sense amplifiers SAC3 shared by memory blocks MK2 and MK3 are provided in the region between memory blocks MK2 and MK3. A sense amplifier SA from line of sense amplifiers SAC3 is correspondingly provided, for instance, to odd-numbered bit line pairs BLP of memory blocks MK2 and MK3.

For example, when memory block MK2 is selected, each of sense amplifiers SA in lines of sense amplifiers SAC2 and SAC3 is connected to a corresponding bit line pair BLP in memory block MK2, as shown in FIG. 4. A sense amplifier SA corresponding to a selected column of line of sense amplifiers SAC2 is connected to local IO line pair LIO2, and is further connected to global IO line pair GIO2 via block selecting switch BS. Moreover, a sense amplifier SA corresponding to a selected column in line of sense amplifiers SAC3 is connected to local IO line pair LIO3, and is further connected to a global IO line pair (not shown) via a block selecting switch (not shown).

Figure 5:
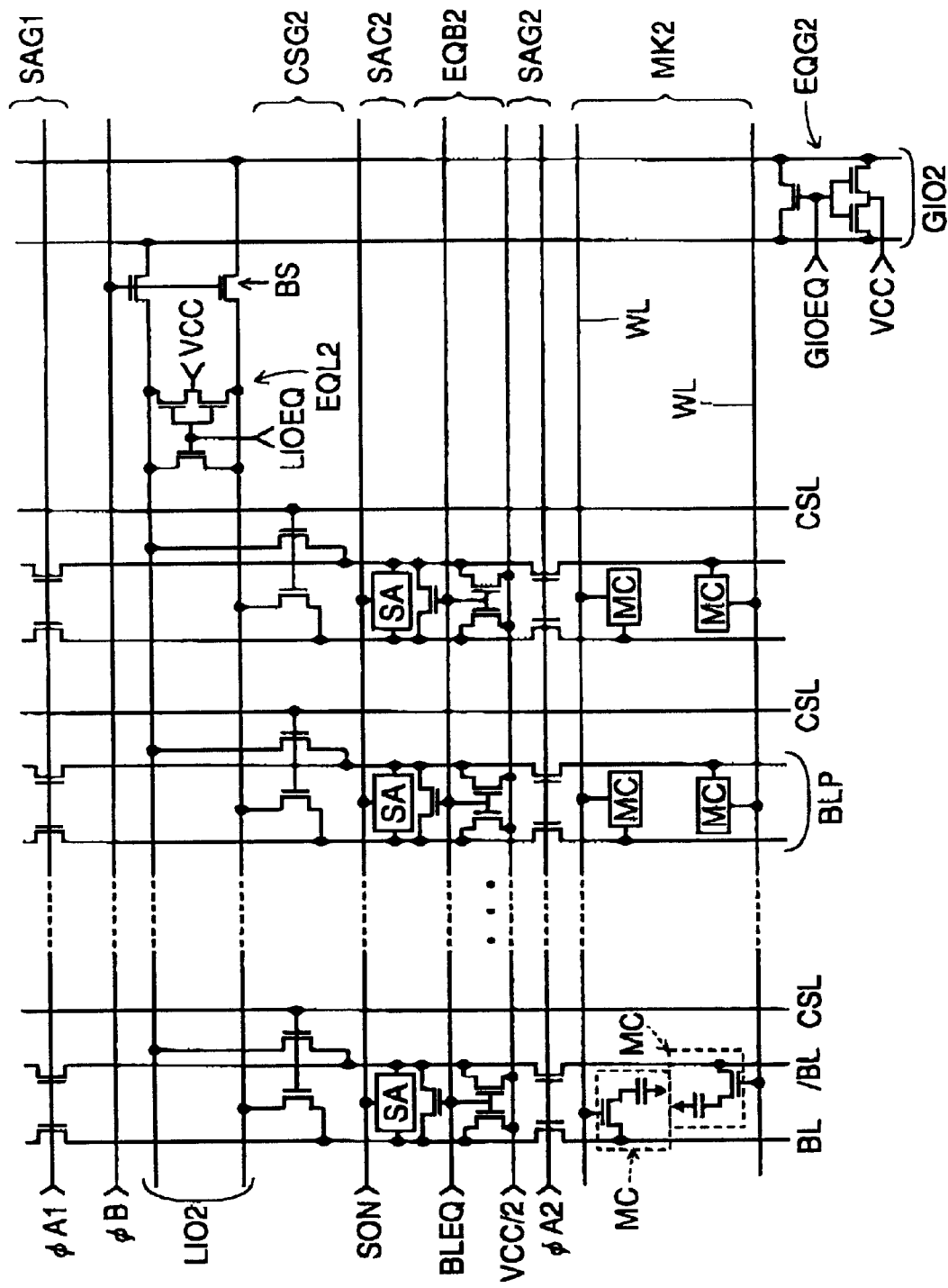
FIG. 5 is a circuit block diagram illustrating the configuration of a memory block MK2 shown in FIG. 4.

FIG. 5 is a circuit block diagram partially illustrating the configuration of a portion related to one memory block MK2. For simplicity, FIG. 5 only shows the portion of memory block M2 that is related to local IO line pair LIO2 and line of sense amplifiers SAC2. The portion related to local IO line pair LIO3 and line of sense amplifiers SAC3 is not shown.

As shown in FIG. 5. memory block MK2 includes a word line WL to which a row select signal from row decoder 11a is transmitted, a bit line pair BLP arranged in a direction intersecting word line WL, and a dynamic memory cell MC provided corresponding to the intersecting portion of word line WL and bit line pair BLP. Memory cell MC includes an access transistor and a capacitor for storing information. Bit line pair BLP includes bit lines BL and /BL on which complementary signals are transmitted.

An array selecting gate SAG1 is provided on local IO line pair LIO2 side of memory block MK1, not shown, and an array selecting gate SAG2 is provided on local IO line pair LIO2 side of memory block MK2. Array selecting gate SAG1 is rendered conductive in response to an array selecting signal φA1, and array selecting gate SAG2 is rendered conductive in response to an array selecting signal φA2. Bit line pairs BLP of memory blocks MK1 and MK2 are connected to a sense amplifier SA in line of sense amplifiers SAC2 via array selecting gates SAG1 and SAG2, respectively. A sense amplifier SA is activated by a sense amplifier activating signal SON.

Each sense amplifier SA is provided with a bit line equalizer EQB2 for applying a precharge potential VCC/2 to bit lines BL and /BL connected to the sense amplifier SA. During a data read operation, bit line equalizer EQB2 is activated by a bit line equalizing signal BLEQ during the time period before sense amplifier SA is activated.

In addition, each sense amplifier SA is provided with a column select gate CSG2 for transmitting the data detected and amplified by the sense amplifier SA to local IO line pair LIO2. Local IO line pair LIO2 is provided with a local IO line equalizer EQL2 activated by a local IO line equalizing signal LIOEQ for applying a precharge potential VCC to local IO line pair LIO2. A block selecting signal BS rendered conductive in response to a block selecting signal φB is provided between local IO line pair LIO2 and a global IO line pair GIO2. Global IO line pair GIO2 is provided with a global IO line equalizer EQG2 activated by a global IO line equalizing signal GIOEQ for applying a precharge potential VCC to global IO line pair GIO2.

Figure 6:
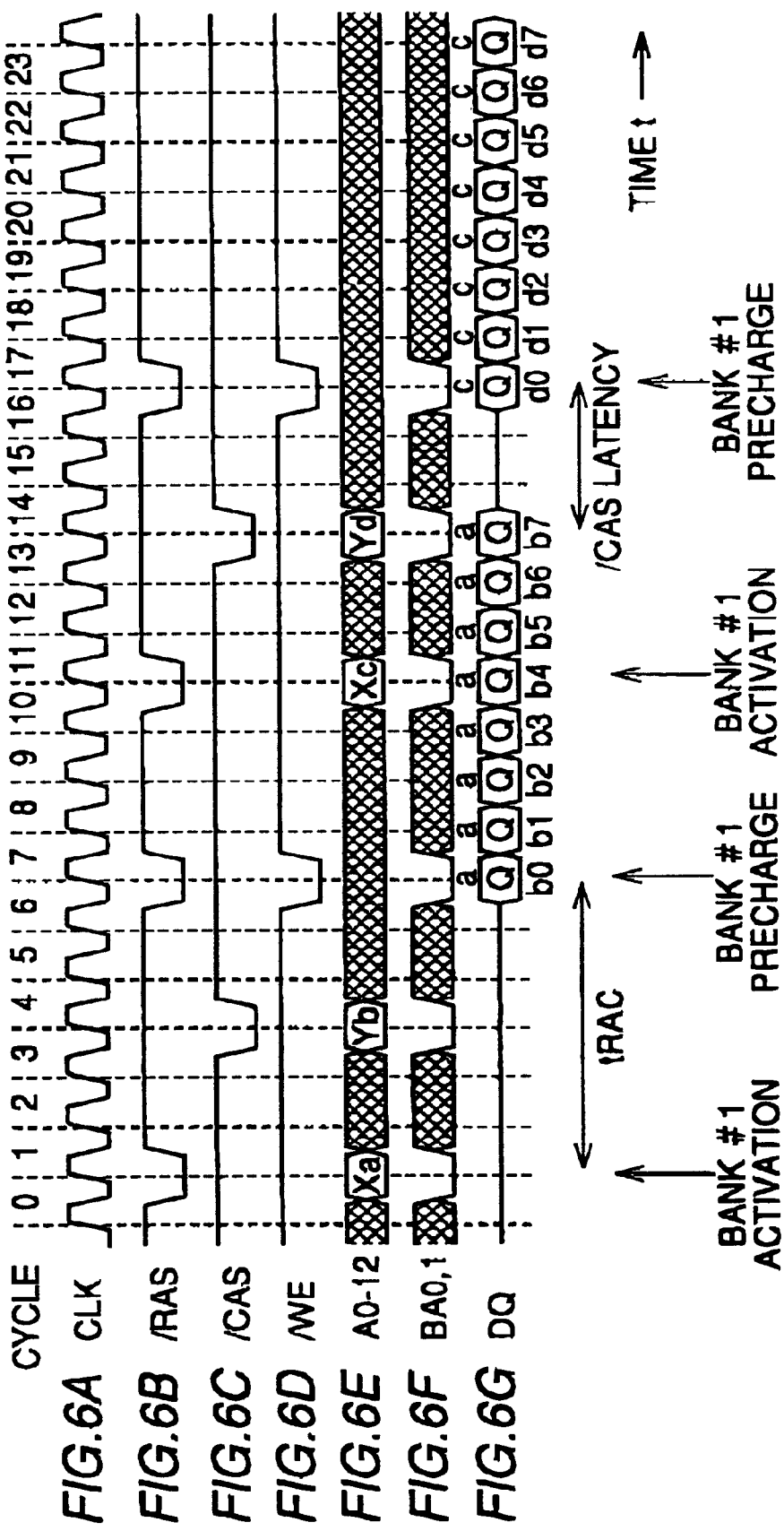
FIGS. 6A to 6G are timing charts illustrating a successive read operation of an SDRAM shown in FIGS. 1 to 5.
Figure 7:
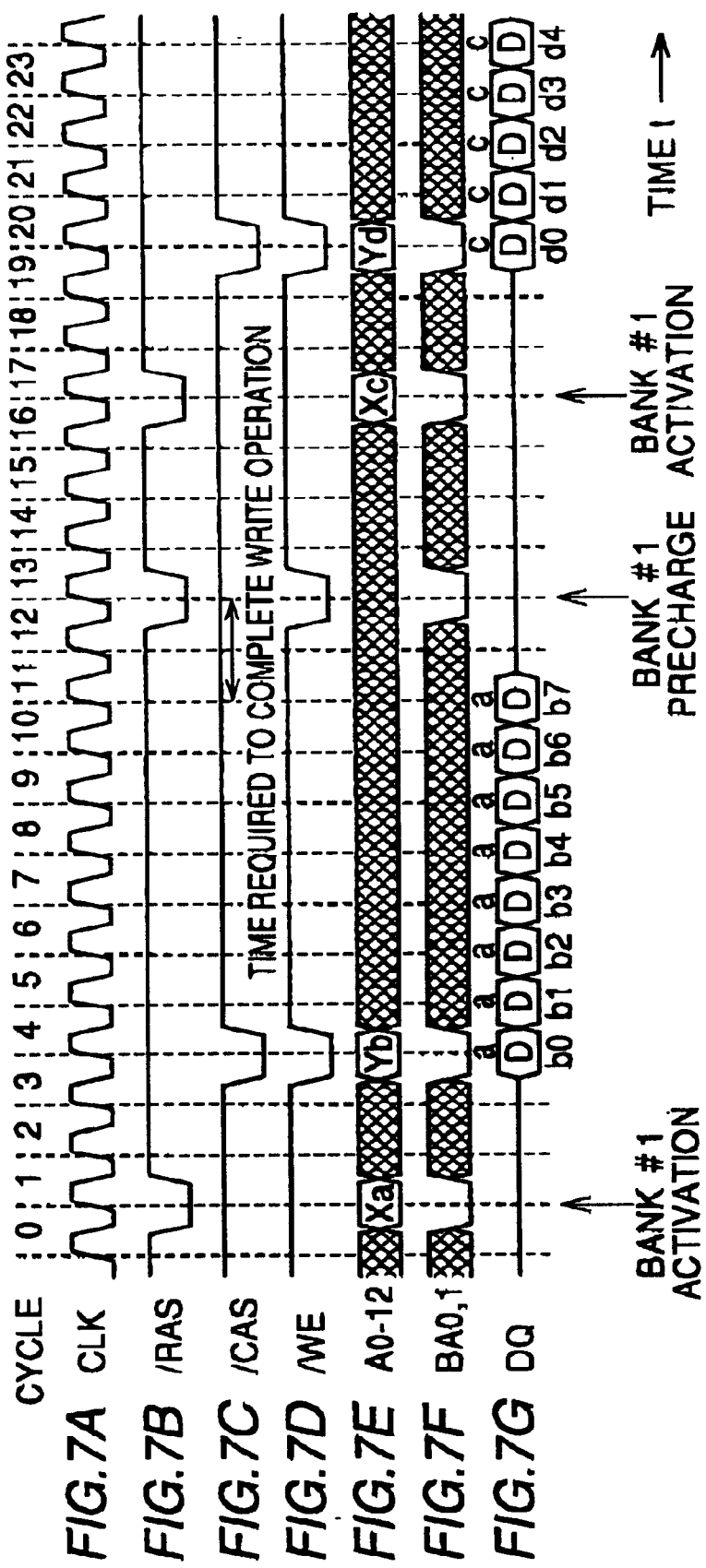
FIGS. 7A to 7G are timing charts illustrating a successive write operation of an SDRAM shown in FIGS. 1 to 5.

Now, the operation of the circuit shown in FIG. 6 will be briefly described below. First, equalizing signals BLEQ, LIOE, and GIOEQ attain the "L" level, and the equalization of bit line pair BLP, local IO line pair LIO, and global IO line pair GIO is interrupted, and one word line WL is selected by row decoder 11a. When the selected word line WL is contained in memory block MK2, an array selecting signal φA2 attains the active level, and a bit line pair BLP contained in memory block MK2 is connected to a sense amplifier SA in line of sense amplifiers SAC2. Array selecting gate SAG1 provided for memory block MK1 is rendered non-conductive. Memory block MK1 maintains the precharged state.

In memory block MK2, after memory cell data appear on each bit line pair BLP, a sense amplifier SA is activated, and thus detects and amplifies the memory cell data.

Thereafter, when column select line CSL is raised to the "H" level or the active level, a column select gate CSG2 is rendered conductive, and the data detected and amplified in sense amplifier SA is transmitted to local IO line pair LIO2.

Thereafter, block selecting signal φB attains the "H" level or the active level, and local IO line pair LIO2 is connected to global IO line pair GIO2. During a data read operation, the data on global IO line pair GIO2 is output to the outside via local column circuit 14a, data bus DB and input/output pad 16. During a data write operation, the write data provided from outside via input/output pad 16, data bus DB, and local column circuit 14a is transmitted to a selected bit line pair BLP via global IO line pair GIO2 and local IO line pair LIO2, thereby performing the data write operation to memory cell MC.

Block selecting signal φB attains the active level only in relation to memory block MK2 to which a selected word line WL belongs. The same is true for array selecting signals φA1 and φA2. Block selecting signal φB and array selecting signals φA1 and φA2 can be generated using a prescribed number of bits (for instance, four bits) of a row address signal.

FIGS. 6A to 6G are timing charts illustrating the state of external signals in the operation in which 8 bits of data are read out successively in the above-described SDRAM. The number of bits of data read out or written into successively is called the burst length, which can be changed by mode register 4 in an SDRAM.

In the SDRAM, an external control signal and address signals A0 to A12 are taken in at the rising edge of external clock signal CLK. Address signals A0 to A12 include a row address signal X and a column address signal Y that are time-division multiplexed.

At the rising edge of clock signal CLK in cycle 1, if a signal /RAS is at the "L" level or the active level and signals /CAS and /WE are at the "H" level, address signals A0 to A12 at that time would be taken in as a row address signal Xa.

Next, at the rising edge of clock signal CLK in cycle 4, if signal /CAS is at the "L" level or the active level, address signals A0 to A12 at that time would be taken in as a column address signal Yb. The row and column select operations are performed in SDRAM according to row address signal Xa and column address signal Yb taken in. When a prescribed clock period (six clock cycles in FIG. 6) has passed after signal /RAS falls to the "L" level, the first data b0 is output. Thereafter, data b1 to b7 are output sequentially in response to the fall of dock signal CLK.

FIGS. 7A to 7G are timing charts illustrating the states of external signals in the operation in which 8 bits of data are written in successively in the SDRAM.

During the write operation, row address signal Xa is taken in the same way as in the data read operation. In other words, at the rising edge of clock signal CLK in cycle 1, if signal /RAS is at the "L" level or the active level and signals /CAS and /WE are at the "H" level, address signals A0 to A12 at that time would be taken in as a row address signal Xa. At the rising edge of clock signal CLK in cycle 4, if signals /CAS and /WE are both at the "L" level or the active level, a column address signal Yb would be taken in, while at the same time, data b0 provided at that time would be taken in as the fist write data. The row and column select operations are performed in SDRAM according to the rising edges of signals /RAS and /CAS. Input data b1 to b7 are sequentially taken in in synchronism with clock signal CLK, and thus the input data are sequentially written into memory cells.

Figure 8:
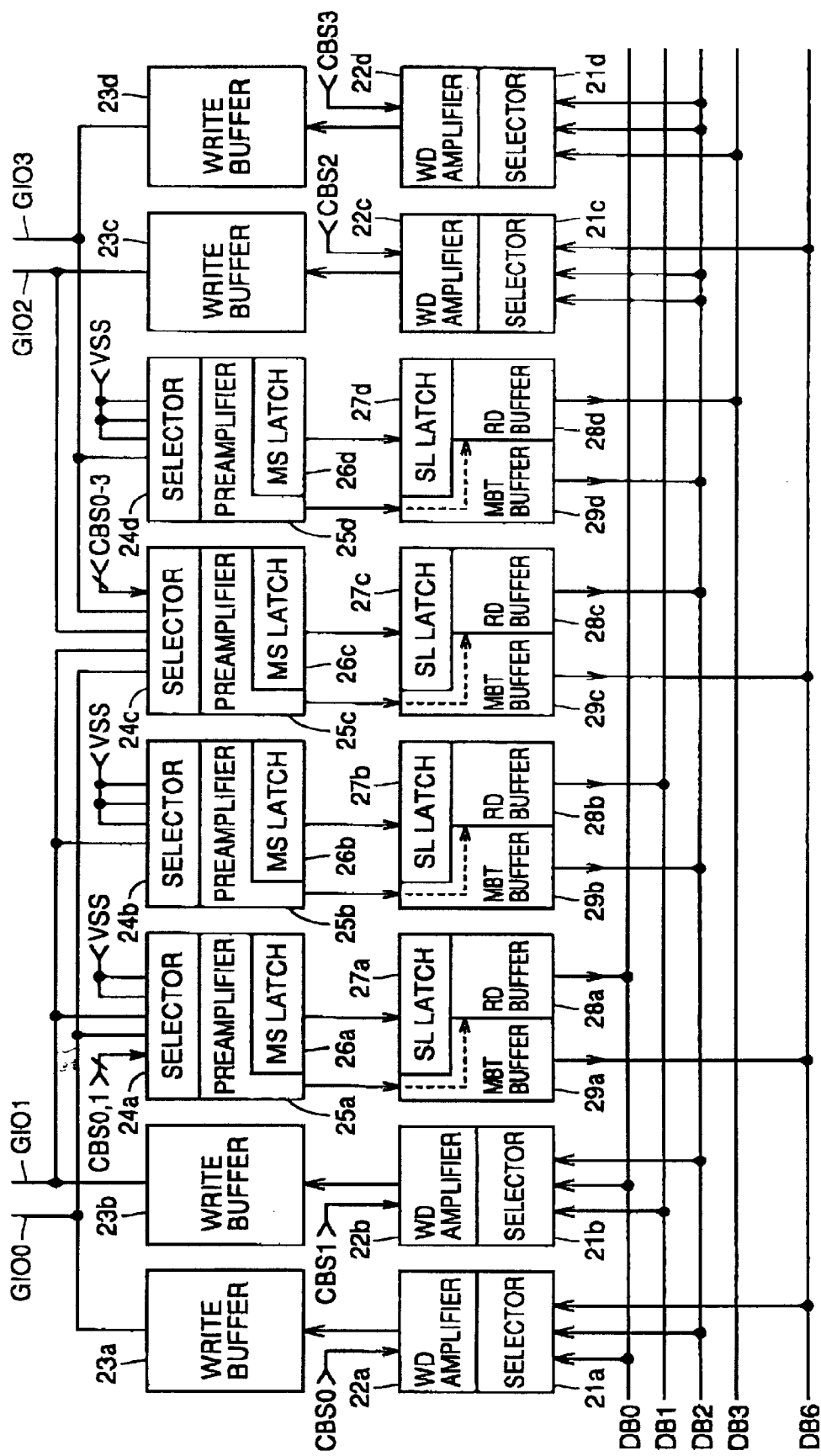
FIG. 8 is a block diagram showing the configuration of a local column circuit shown in FIG. 2.

The portion related to a data read/write operation characterizing the present invention will be described in detail below. FIG. 8 is a block diagram showing the portion corresponding to a memory mat MM1a in local column circuit 14a shown in FIG. 2. As shown in FIG. 8, local column circuit 14a includes selectors 21a to 21d, WD amplifiers 22a to 22d, and write buffers 23a to 23d.

Selectors 21a to 21d connect data bus DB2 to WD amplifiers 22a to 22d during a write operation in x4 configuration, and connect data bus DB0 to WD amplifiers 22a and 22b and data bus DB2 to WD amplifiers 22c and 22d during a write operation in x8 configuration. Moreover, selectors 21a to 21d connect data buses DB0 to DB3 respectively to WD amplifiers 22a to 22d during a write operation in x16 configuration, and connect data bus DB2 to WD amplifier 22b and 22d and data bus DB6 to WD amplifiers 22a and 22c during MBT.

WD amplifiers 22a to 22d are respectively activated in response to signals CBS0 to CBS3 attaining the "H" level or the active level, and amplify the data provided from outside via data buses DB0 to DB3 and DB6 to apply the amplified data to write buffers 23a to 23d. Signals CBS0 to CBS3 are generated from column address signals CA9 and CA11. Write buffers 23a to 23d respectively transmit the data provided by WD amplifiers 22a to 22d to global IO line pairs GIO0 to GIO3.

During the write operation in x4 configuration, one of signals CBS0 to CBS3 (for instance CBS0) attains the "H" level or the active level, and the data provided to data bus DB2 from outside is transmitted to a global IO line pair GIO0 via selector 21a, WD amplifier 22a, and write buffer 23a.

During the write operation in x8 configuration, one of signals CBS0 and CBS1 (for instance CBS0) and one of signal CBS2 and CBS3 (for instance CBS2) attain the "H" level or the active level, and the data provided to data bus DB0 from outside is transmitted to global IO line pair GIO0 via selector 21a, WD amplifier 22a, and write buffer 23a, while the data provided to data bus DB2 from outside is transmitted to global IO line pair GIO2 via selector 21c, WD amplifier 22c, and write buffer 23c.

During the write operation in x16 configuration, signals CBS0 to CBS3 all attain the "H" level or the active level, and the data provided to data buses DB0 to DB3 from outside are respectively transmitted to global IO line pairs GIO0 to GIO3 via selectors 21a to 21d, WD amplifiers 22a to 22d, and write buffers 23a to 23d.

During the write operation in MBT, signals CBS0 to CBS3 all attain the "H" level or the active level, and the data provided to data bus DB2 from outside is transmitted to global IO line pairs GIO1 and GIO3 via selectors 21b and 21d, WD amplifiers 22b and 22d, and write buffers 23b and 23d, while the data provided to data bus DB6 from outside is transmitted to global IO line pairs GIO0 and GIO2 via selectors 21a and 21c, WD amplifiers 22a and 22c, and write buffers 23a and 28c.

In addition, local column circuit 14a includes selectors 24a to 24d, preamplifiers 25a to 25d, master latch circuits 26a to 26d, slave latch circuits 27a to 27d, RD buffers 28a to 28d, and MBT buffers 29a to 29d.

During the read operation in x4 configuration, selectors 24a to 24d connect one of global IO line pairs GIO0 to GIO3 in a pulsed manner to preamplifier 25c according to signals CBS0 to CBS3. During the read operation in x8 configuration, selectors 24a to 24d connect one of global IO line pairs GIO0 and GIO1 in a pulsed manner to preamplifier 25a according to signals CBS0 and CBS1 and one of global IO line pairs GIO2 and GIO3 in a pulsed manner to preamplifier 25c according to signals CBS2 and CBS3. During the read operations in x16 configuration and in MBT, selectors 24a to 24d connect global IO line pairs GIO0 to GIO3 in a pulsed manner to preamplifiers 25a to 25d, respectively. Signals CBS0 to CBS3 are generated in column predecoder 13a and column decoder 12a based on the 2 bits contained in the column address signal.

Preamplifiers 25a to 25d respectively amplify the read data signals provided from global IO line pairs GIO via selectors 24a to 24d. The output signals from preamplifiers 25a to 25d are respectively applied to master latch circuits 26a to 26d, and inverted output signals of the respective preamplifiers 25a to 25d are applied to RD buffers 28a to 28d and MBT buffers 29a to 29d, respectively. Latch circuits 26a, 27a, 26b, 27b, 26c, 27c, 26c, and 27d each form a CL shifter, delay the output signals from preamplifiers 25a to 25d by one clock cycle, and provides the delayed output signals to RD buffers 28a to 28d and MBT buffers 29a to 29d. Master latch circuit 26c and slave latch circuit 27c respectively are disposed close to preamplifier 25c and buffers 28c and 29c so as to make the area covered by selector 24c, preamplifier 25c, and master latch circuit 26c equal to the area covered by slave latch circuit 27c, and buffers 28c and 29c.

RD buffers 28a to 28d are respectively activated during the read operation, and drive data buses DB0 to DB3 in a pulsed manner according to output signals from preamplifiers 25a to 25d and output signals from slave latch circuits 27a to 27d. MBT buffers 29a to 29d respectively are activated during the read operation in MBT, and drive data buses DB6, DB2, DB6, and DB2 in a pulsed manner according to output signals from preamplifiers 25a to 25d and output signals from slave latch circuits 27a to 27d.

During the read operation in x4 configuration, only selector 24c among selectors 24a to 24d is activated, while at the same time, one of signals CBS0 to CBS3 (for instance, CBS0) attains the "H" level or the active level, and the data read out on a global IO line pair (in this case, GIO0) is provided in a pulsed manner to data bus DB2 via selector 24c, preamplifier 25c, latch circuits 26c and 27c, and RD buffers 28c.

During the read operation in x8 configuration, two selectors 24a and 24c among selectors 24a to 24d are activated, and one of signals CBS0 and CBS1 (for instance, CBS0) attains the "H" level or the active level, thereby causing the data read out on a global IO line pair (in this case, GIO0) to be provided in a pulsed manner to data bus DB0 via selector 24a, preamplifier 25a, latch circuits 26a and 27a, and RD buffers 28a, while at the same time, one of signals CBS2 and CBS3 (for instance, CBS2) attains the "H" level or the active level, thereby causing the data read out on a global IO line pair (in this case, GIO2) to be provided in a pulsed manner to data bus DB2 via selector 24c, preamplifier 25c, latch circuits 26c and 27c, and RD buffers 28c.

During the read operation in x16 configuration, four selectors 24a to 24d are all activated, while at the same time, signals CBS0 and CBS3 attain the "H" level or the active level, and the data read out on global IO line pairs GIO0 to GIO3 are respectively provided in a pulsed manner to data buses DB0 to DB3 via selectors 24a to 24d, preamplifiers 25a to 25d, latch circuits 26a to 26d and 27a to 27d, and RD buffers 28a to 28d.

During the read operation in MBT, four selectors 24a to 24d are all activated, while at the same time, signals CBS0 and CBS3 attain the "H" level or the active level, and the data read out on global IO line pairs GIO0 to GIO0 are respectively provided in a pulsed manner to data buses DB6, DB2, DB6, and DB2 via selectors 24a to 24d, preamplifiers 25a to 25d, latch circuits 26a to 26d and 27a to 27d, and MBT buffers 29a to 29d.

Figure 9:
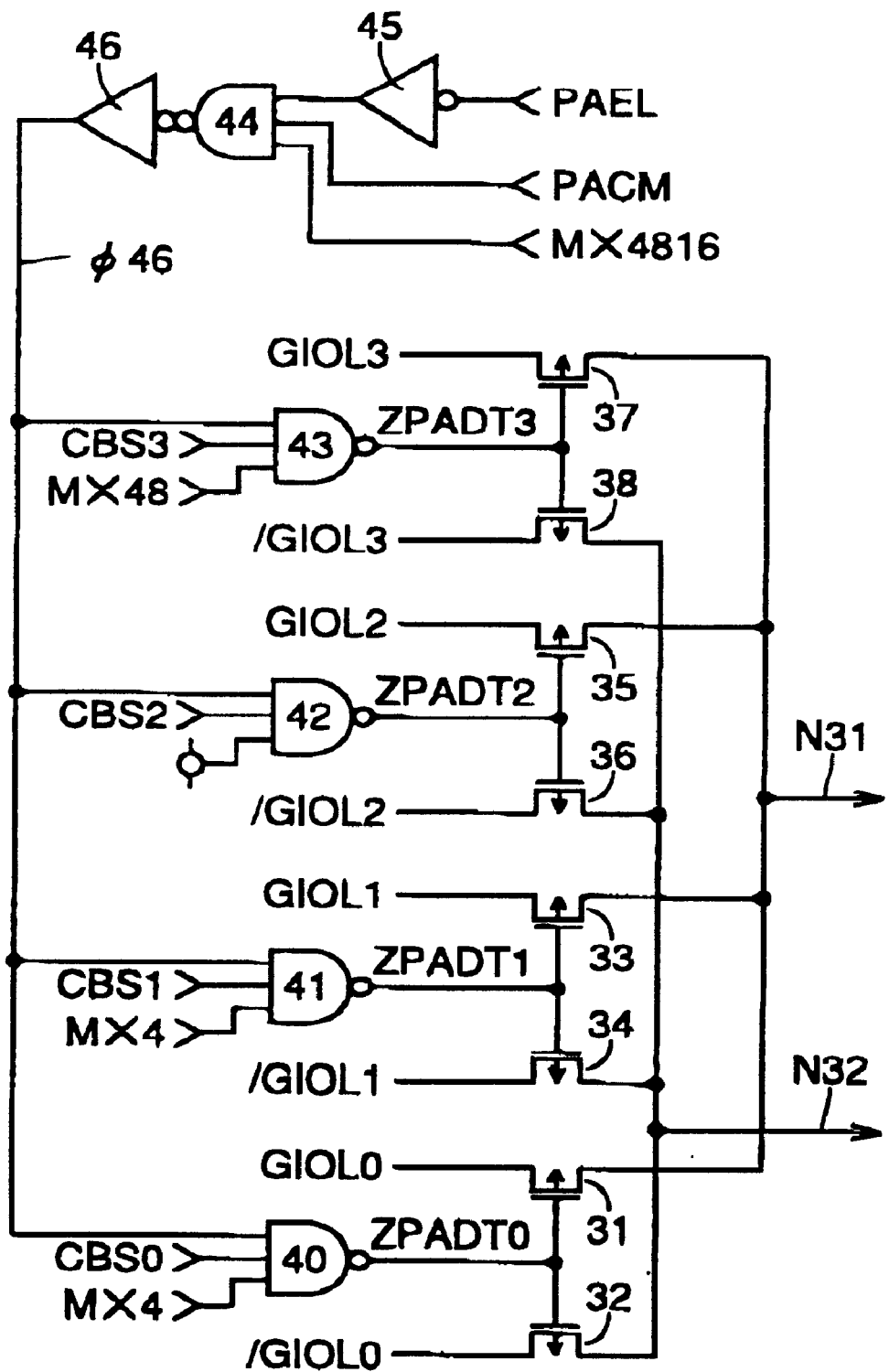
FIG. 9 is a circuit diagram illustrating the configuration of a selector 24$c$ shown in FIG. 8.

The portion related to a data read operation of the SDRAM will be described in further detail below. Selector 24c includes P-channel MOS transistors 31 to 38, NAND gates 40 to 44, and inverters 45 and 46, as shown in FIG. 9. P-channel MOS tractors 31, 33, 35, and 37 are respectively connected between global IO lines GIOL0 to GIOL3 and a node N31. P-channel MOS transistors 32, 34, 36, and 38 are respectively connected between global IO lines /GIOL0 to /GIOL3 and a node N32.

A signal PAEL is inverted by inverter 45. NAND gate 44 receives an output signal from inverter 45, a signal PACM, and a signal Mx4816. An output signal of NAND gate 44 is inverted by inverter 46 and becomes a signal φ46. NAND gate 40 receives signals φ46, CBS0, and Mx4, and an output signal ZPADT0 from NAND gate 40 is input to the gates of P-channel MOS transistors 31 and 32. NAND gate 41 receives signals φ46, CBS1, and Mx4, and an output signal ZPADT1 from NAND gate 41 is input to the gates of P-channel MOS transistors 33 and 34 NAND gate 42 receives signals φ46, CBS2, and an "H" level signal, and an output signal ZPADT2 from NAND gate 42 is input to the gates of P-channel MOS transistors 35 and 36. NAND gate 43 receives signals φ46, CBS3, and Mx48, and an output signal ZPADT3 from NAND gate 43 is input to the gates of P-channel MOS transistors 37 and 38.

Here, word configuration selecting signal Mx4816 attains the "H" level in all word configurations of x4, x8, and x16. Signal Mx4 attains the "H" level in x4 word configuration, and signal Mx48 attains the "H" level in x4 and x8 word configurations.

Other selectors 24a, 24b and 24d have the same configuration as selector 24c. In selector 24a, however, "L" level signals are applied to NAND gates 42 and 43 in place of signals CBS2 and CBS3, and signals ZPADT2 and ZPADT3 are fixed to the "H" level, thereby fixing P-channel MOS transistors 35 to 38 in the non-conductive state. Moreover, a signal Mx816 in place of signal Mx4 is applied to NAND gate 40, and a signal Mx8 in place of signal Mx4 is applied to NAND gate 41. Signal Mx816 attains the "H" level in x8 and x16 word configurations, and signal Mx8 attains the "H" level in x8 word configuration.

In selector 24b, "L" level signals are applied to NAND gates 40, 42, and 43 in place of signals CBS0, CBS2, and CBS3, and signals ZPADT0, ZPADT2, and ZPADT3 are fixed to the "H" level, thereby fixing P-channel MOS transistors 31, 32, and 35 to 37 in the non-conductive state. Moreover, a signal Mx16 in place of signal Mx4 is applied to NAND gate 41. Signal Mx16 attains the "H" level in x16 word configuration.

In selector 24d, "L" level signals are applied to NAND gates 40 to 42 in place of signals CBS0 to CBS2, and signals ZPADT0 to ZPADT2 are fixed to the "H" level, thereby fixing P-channel MOS transistors 31 to 36 in the non-conductive state. Moreover, a signal Mx16 in place of signal Mx48 is applied to NAND gate 43.

Figure 10:
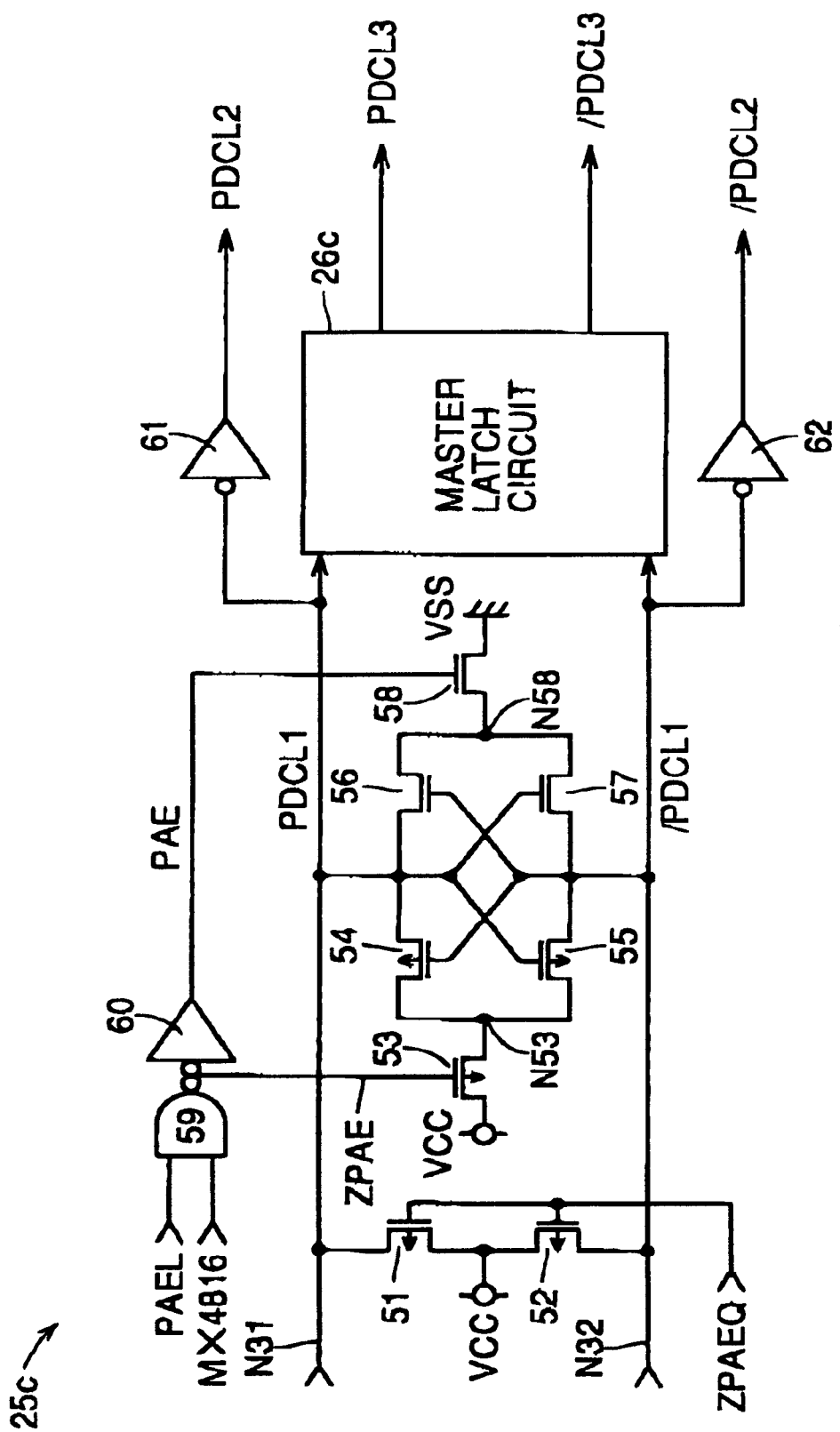
FIG. 10 is a circuit diagram illustrating the configuration of a preamplifier 25$c$ shown in FIG. 8.

Preamplifier 25c includes P-channel MOS transistors 51 to 55, N-channel MOS transistors 56 to 58, an NAND gate 59, and inverters 60 to 62, as shown in FIG. 10. P-channel MOS transistors 51 and 52 are connected in series between node N31 and node N32 shown in FIG. 9, and receive a signal ZPAEQ at their respective gates. P-channel MOS transistors 51 and 52 form an equalizer. When signal ZPAEQ attains the "L" level or the active level, P-channel MOS transistors 51 and 52 are rendered conductive, equalizing nodes N31 and N32 to the "H" level.

P-channel MOS transistor 53 is connected between a power-supply potential VCC line and a node N53, and P-channel MOS transistors 54 and 55 are connected between node N53 and nodes N31 and N32, respectively. N-channel MOS transistors 56 and 57 are connected between nodes N31 and N32 and a node N58, respectively, and P-channel MOS transistor 58 is connected between node N58 and a ground potential VSS line. Gates of MOS transistors 53 and 58 respectively receive signals ZPAE and PAE. Gates of MOS transistors 54 and 56 are both connected to node N32, and gates of MOS transistors 55 and 57 are both connected to node N31. MOS transistors 53 to 58 form a differential amplifier. This differential amplifier is activated in response to signals ZPAE and PAE respectively attaining the "L" level and the "H" level, causing either node N31 or node N32 having the higher potential to attain the "H" level while causing the other node to attain the "L" level. Signals appearing on nodes N31 and N32 become output signals PDCL1 and /PDCL1 from preamplifier 25c.

NAND 59 receives signals PAEL and Mx4816, and an output signal from NAND 59 becomes signal ZPAE. Signal ZPAE is inverted in inverter 60 and becomes signal PAE. Signals PDCL1 and /PDCL1 are respectively inverted in inverters 61 and 62 and become inverted output signals PDCL2 and /PDCL2 of preamplifier 25c. Other preamplifiers 25a, 25b, and 25d have the same configuration as preamplifier 25c.

FIGS. 11A to 11H are timing charts illustrating the operations of selector 24c and preamplifier 25c shown in FIGS. 9 and 10. When a column select signal CSL is raised to the "H" level or the active level, signal ZPAEQ falls to the "H" level or the inactive level, rendering P-channel MOS transistors 51 and 52 in FIG. 10 non-conductive, and thus the equalization of nodes N31 and N32 is interrupted. In addition, a preamplifier activating master signal PACM rises to the "H" level or the active level, and the delay signal of preamplifier activating master signal PACM, i. e. a preamplifier activating local signal PAEL, rises to the "H" level or the active level.

Thus, signal φ46 in FIG. 9 attains and maintains the "H" level from the time signal PACM rises to the "H" level until the time signal PAEL rises to the "H" level. Thus, of signals ZPADT0 to ZPADT3, a signal (for instance, ZPADT0) selected by signals Mx4, Mx48, and CBS0 to CBS3 attains the "L" level in a pulsed manner, rendering corresponding P-channel MOS transistors (in this case, 31 and 32) in a pulsed manner so that the potentials of global IO lines GIOL0 and /GIOL0 are transmitted to nodes N31 and N32. Thereafter, the equalization of global IO lines GIOL0 and /GIOL0 is effected.

In addition, when signal PAEL attains the "H" level, signals ZPAE and PAE respectively attain the "L" level and the "H" level, activating the differential amplifier formed by MOS transistors 53 to 58, thus causing either node N31 or node N32 having the higher potential to attain the "H" level while causing the other node to attain the "L" level. Output signals PDCL1 and /PDCL1 from preamplifier 25c are applied to master latch circuit 26c, and inverted output signals PDCL2 and /PDCL2 of preamplifier 25c are applied to RD buffer 28c and MBT buffer 29c.

Figure 12:
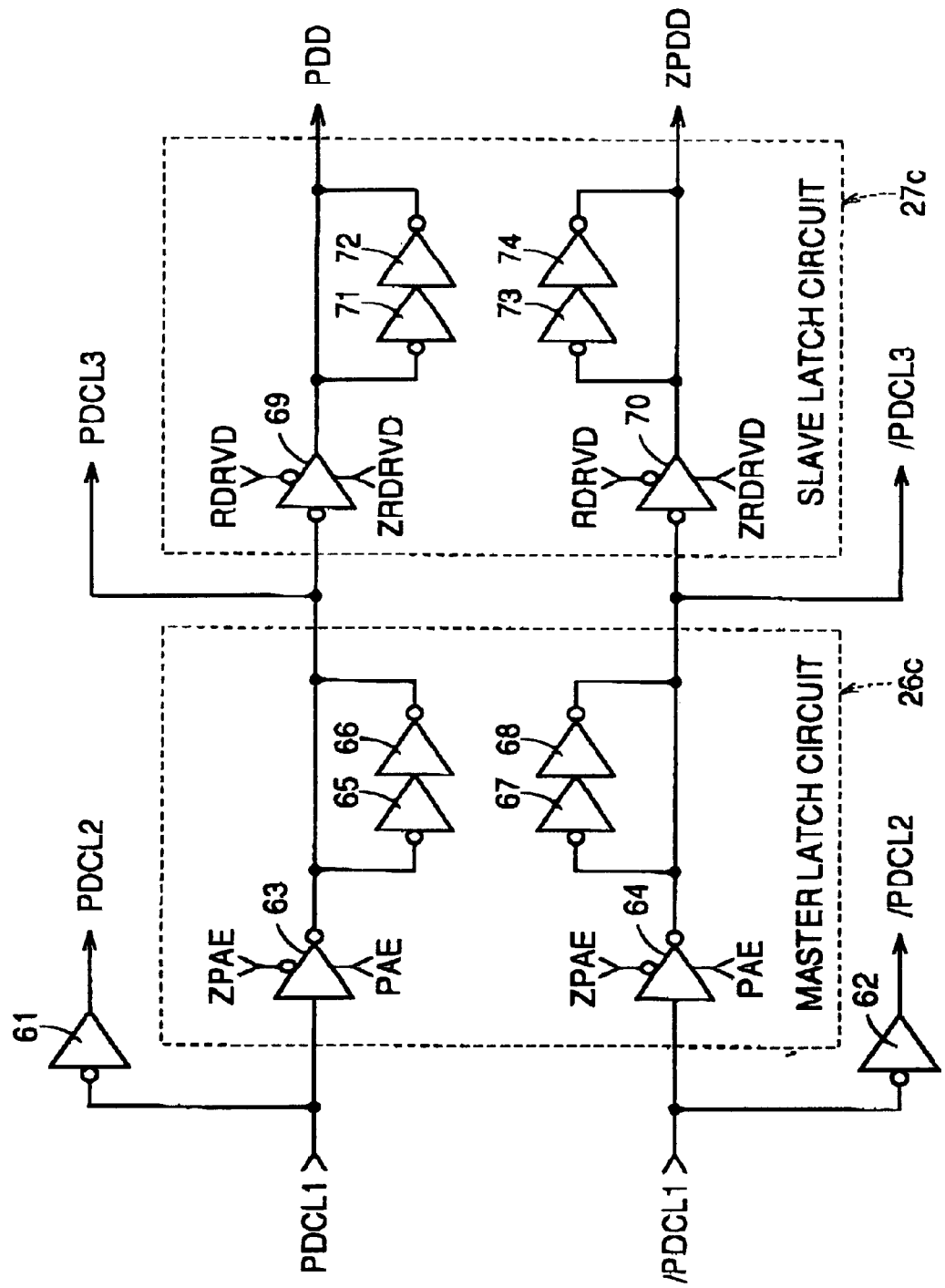
FIG. 12 is a circuit diagram illustrating the configurations of a master latch circuit 26$c$ and a slave latch circuit 27$c$ shown in FIG. 8.

Master latch circuit 26c includes clocked inverters 63 and 64, and inverters 65 to 68, as shown in FIG. 12. Signals PFDCL1 and /PDCL1 are input to clocked inverters 63 and 64, respectively. Clocked inverters 63 and 64 are both activated during the period in which signals PAE and ZPAE are at the "H" level and the "L" level, respectively. Inverters 65 and 66 form a latch circuit, and latches an output level of clocked inverter 63. Inverters 67 and 68 form a latch circuit, and latches an output level of clocked inverter 64. The levels latched in inverters 65 and 66 and inverters 67 and 68 become output signals PDCL3 and /PDCL3 from master latch circuit 26c, respectively.

Slave latch circuit 27c includes clocked inverters 69 and 70, and inverters 71 to 74, as shown in FIG. 12. Signals PDCL3 and /PDCL3 are input to clocked inverters 69 and 70, respectively. Clocked inverters 69 and 70 are both activated during the period in which signals ZRDRVD and RDRVD are at the "H" level and the "L" level, respectively. Inverters 71 and 72 form a latch circuit, and latches an output level of clocked inverter 69. Inverters 73 and 74 form a latch circuit, and latches an output level of clocked inverter 70. The levels latched in inverters 71 and 72 and inverters 73 and 74 become output signals PDD and ZPDD from slave latch circuit 27c, respectively.

When signals PAE and ZPAE attain the "H" level and the "L" level, respectively, clocked inverters 63 and 64 are activated, and signals PDCL1 and /PDCL1 are taken into master latch circuit 26c. When signals PAE and ZPAE respectively attain the "L" level, clocked inverters 63 and 64 are rendered inactive, and signals PDCL3 and /PDCL3 are latched into master latch circuit 26c.

When signals ZRDRVD and RDRVD respectively attain the "H" level and the "L" level, clocked inverters 69 and 70 are activated, and signals PDCL3 and /PDCL3 are taken into slave latch circuit 27c. When signals ZRDRVD and RDRVD attain the "L" level and the "H" level, respectively, docked inverters 69 and 70 are rendered inactive, and signals PDD and ZPDD are latched into slave latch circuit 27c.

Master latch circuit 26c and slave latch circuit 27c form a CL shifter, which delays signals PDCL1 and /PDCL1 by one clock cycle and transmits the delayed signals to RD buffer 28c and MBT buffer 29c. Other master latch circuits 26a, 26b, and 26d have the same configuration as the configuration of master latch circuit 26c, and other slave latch circuit 27a, 27b, and 27d have the same configuration as the configuration of slave latch circuit 27c.

Figure 13:
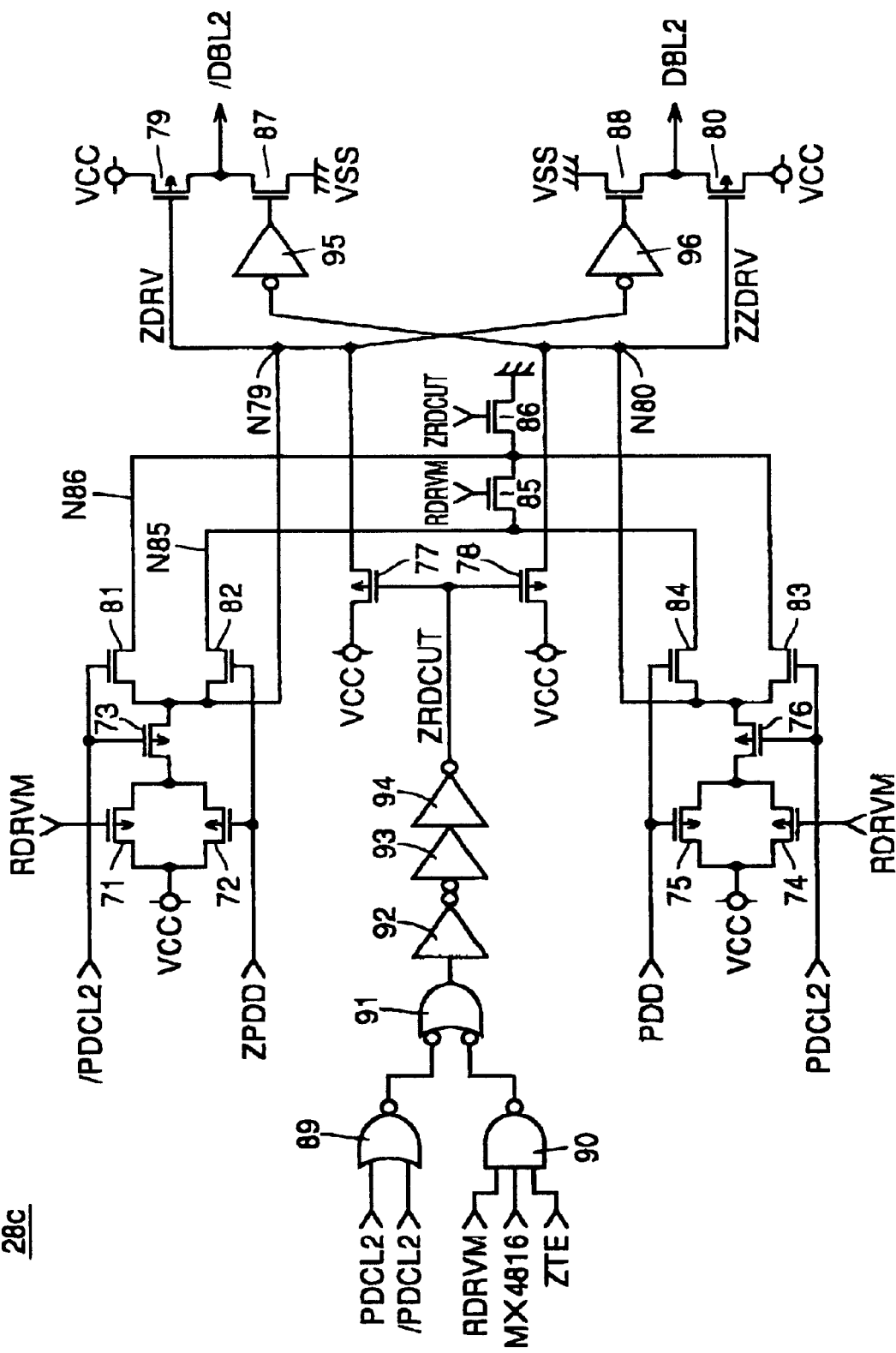
FIG. 13 is a circuit diagram illustrating the configuration of an RD buffer 28$c$ shown in FIG. 8.
Figure 14:
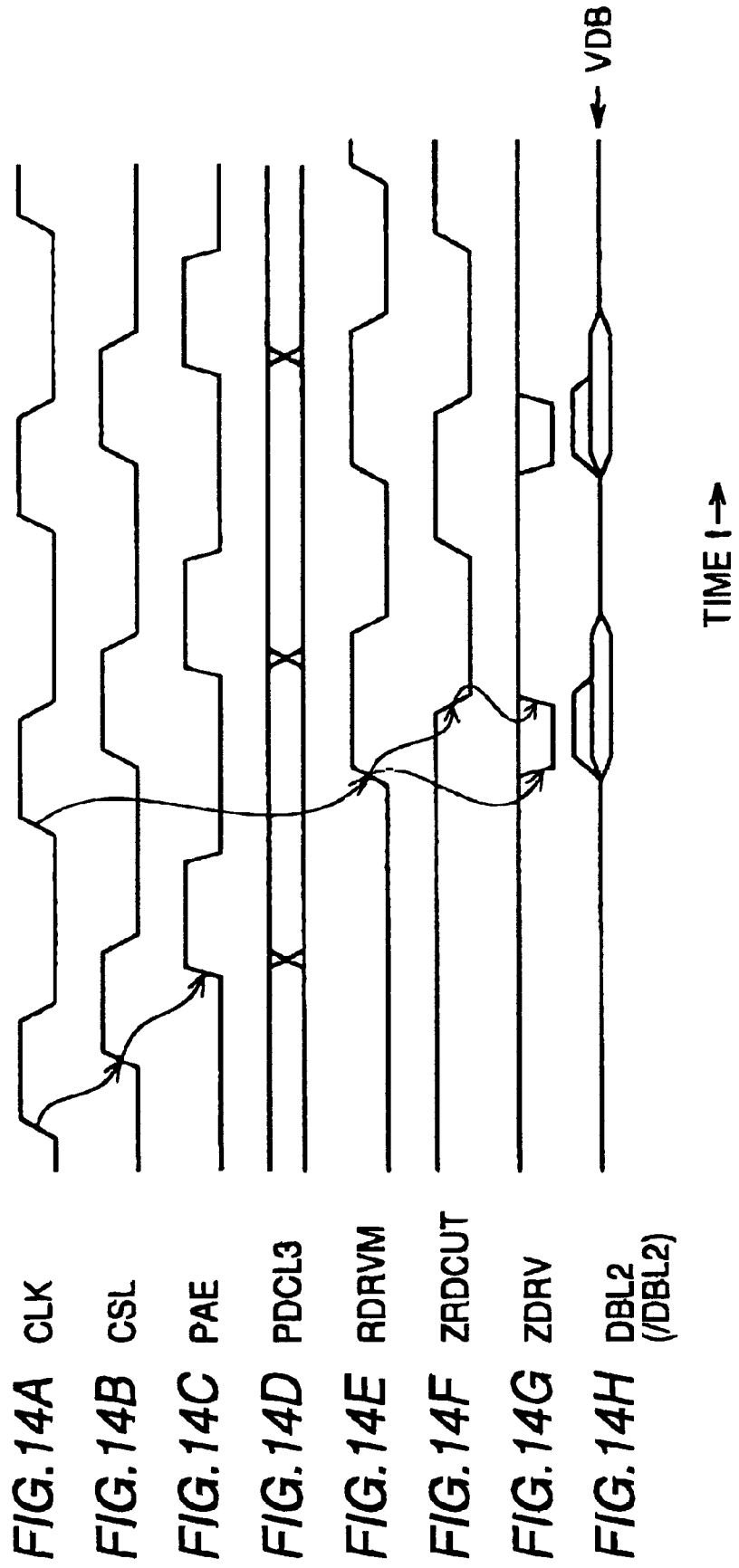
FIGS. 14A to 14H are timing charts illustrating the operation of RD buffer 28$c$ shown in FIG. 13.

RD buffer 28c includes P-channel MOS transistors 71 to 80, N-channel MOS transistors 81 to 88, an NOR gate 89, NAND gates 90 and 91, and inverters 92 to 96, as shown in FIG. 13. P-channel MOS transistors 71 and 72 have their sources connected to a power-supply potential VCC line, and their respective drains are connected to a node N79 via P-channel MOS transistor 73. The signal that appears on node N79 becomes a signal ZDRV. N-channel MOS transistors 82, 85, and 86 are connected in series between node N79 and a ground potential VSS line, and N-channel MOS transistor 81 is connected between node N79 and a drain (node N86) of N-channel MOS transistor 86.

P-channel MOS transistors 74 and 75 have their sources connected to a power-supply potential VCC line, and their respective drains are connected to a node N80 via P-channel MOS transistor 76. The signal that appears on node N80 becomes a signal ZZDRV. N-channel MOS transistors 83 and 84 are connected between node N80 and nodes N85 and N86, respectively. P-channel MOS transistors 77 and 78 are connected between a power-supply potential VCC line and nodes N79 and N80, respectively.

Signal PDD is input to gates of MOS transistors 75 and 84, and signal ZPDD is input to gates of MOS transistors 72 and 82. Signal PDCL2 is input to gates of MOS transistors 76 and 83, and signal /PDCL2 is input to gates of MOS transistors 73 and 81. Signal RDRVM is input to gates of MOS transistors 71, 74, and 85, and a signal ZRDCUT is input to gates of MOS transistors 77, 78, and 86.

P-channel MOS transistors 79 and 80 are connected to a respective power-supply potential VCC line and are connected to data bus lines /DBL2 and DBL2, respectively, and receive at the gates signals ZDRV and ZZDRV, respectively. Data bus lines /DBL2 and DBL2 form a data bus DB2. N-channel MOS transistors 87 and 88 are connected between a ground potential VSS line and data bus lines /DBL2 and DBL2, respectively. Signals ZZDRV and ZDRV respectively are input to the gates of N-channel MOS transistors 87 and 88 via inverters 95 and 96.

NOR gate 89 receives signals PDCL2 and /PDCL2. NAND gate 90 receives signals RDRVM, Mx4816, and ZTE. Signal ZTE is a signal that attains the "L" level during MBT and that attains the "H" level during a normal operation. NAND gate 91 receives output signals from NOR gate 89 and NAND gate 90, and an output signal from NAND gate 91 is input to the gates of P-channel MOS transistors 77 and 78 via inverters 92 to 94. The output signal of inverter 94 is signal ZRDCUT.

FIGS. 14A to 14H are timing charts illustrating the operation of RD buffer 28c shown in FIG. 13. During each clock cycle period, a column select line CSL is raised to the "H" level in response to the rising edge of a clock signal CLK, and further, signal PAE is raised to the "H" level, and an output signal from preamplifier 25c is taken into master latch circuit 26c. As shown in FIGS. 10 and 11, when signal PAE attains the "L" level, signal ZPAEQ attains the "L" level, and nodes N31 and N32 are equalized and thus signals PDCL2 and /PDCL2 both attain the "L" level. In addition, at this time, signal RDRVM is at the "L" level, and signal ZRDCUT is at the "H" level. Therefore, MOS transistors 71, 73, 74, 76, and 86 are rendered conductive, MOS transistors 77, 78, 81, 83, and 85 are rendered non-conductive, and nodes N79 and N80 are at the "H" level. Moreover, since nodes N79 and N80 are at the "H" level, MOS transistors 79, 80, 87 and 88 are rendered non-conductive, and data bus lines DBL2 and /DBL2 are precharged to a precharge potential VDB.

Then, signal RDRVM rises to the "H" level in response to the rising edge of clock signal CLK, and N-channel MOS transistors 85 and 86 are both rendered conductive. Node N80 falls to the "L" level via an N-channel MOS transistor (in this case, 84) that receives at a gate one of signals PDD and ZPDD that has the "H" level (for instance, PDD), and P-channel MOS transistor 80 and N-channel MOS transistor 87 are rendered conductive. Then, signal ZRDCUT falls to the "L" level after the delay time (approximately 1 ns) caused by NAND gates 90 and 91 and inverters 92 to 94, and P-channel MOS transistors 77 and 78 are rendered conductive while N-channel MOS transistor 86 is rendered non-conductive. Node N80 is raised to the "H" level, and P-channel MOS transistor 80 and N-channel MOS transistor 87 are rendered non-conductive. Thus, data bus lines DBL2 and /DBL2 are driven in a pulsed manner for the delay time caused by NAND gates 90 and 91 and inverters 92 to 94.

Other RD buffers 28a, 28b, and 28d have the same configuration as RD buffer 28c. In RD buffer 28a, however, a signal Mx4816 instead of signal Mx4816 is applied to NAND gate 90, and in RD buffers 28b and 28d, a signal Mx16 instead of signal Mx4816 is applied to NAND gate 90.

Figure 15:
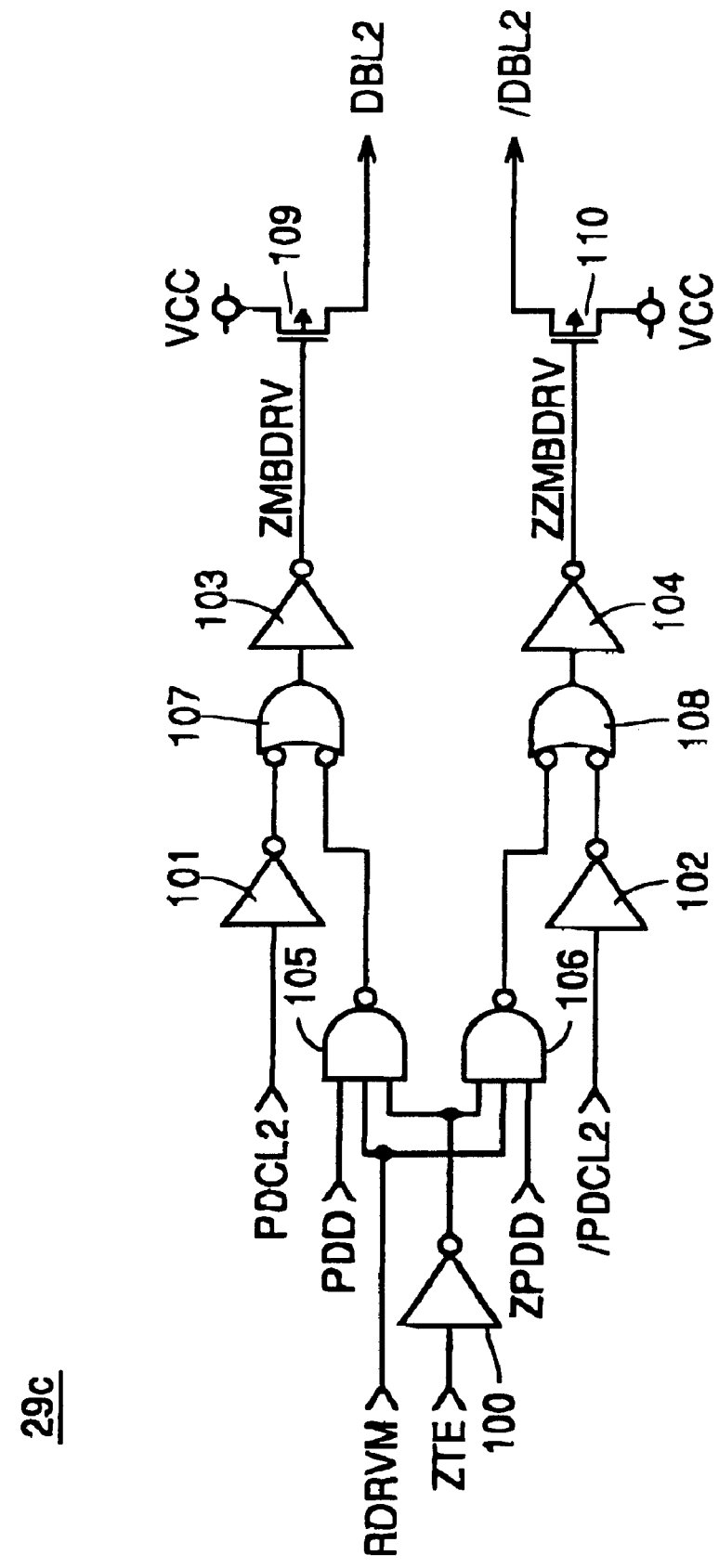
FIG. 15 is a circuit diagram showing the configuration of an MBT buffer 29$c$ shown in FIG. 8.

MBT buffers 29c includes inverters 100 to 104, NAND gates 105 to 108, and P-channel MOS transistors 109 and 110, as shown in FIG. 15. Signal ZTE is inverted by inverter 100. Signals PDCL2 and /PDCL2 are respectively inverted by inverters 101 and 102. NAND gate 105 receives signals PDD and RDRVM and an output signal from inverter 100. NAND gate 106 receives signals ZPDD and RDRVM and an output signal from inverter 100. NAND gate 107 receives output signals from inverter 101 and NAND gate 105, and an output signal from NAND gate 107 is inverted in inverter 103 and becomes a signal ZMBDRV. NAND gate 108 receives output signals from inverters 102 and NAND gate 106, and an output signal from NAND gate 108 is inverted in inverter 104 and becomes a signal ZZMBDRV. P-channel MOS transistors 109 and 110 are connected between a power-supply potential VCC line and data bus lines DBL2 and /DBL2, respectively, and receive at their gates signals ZMBDRV and ZZMBDRV, respectively.

FIGS. 16A to 16H are timing charts illustrating the operation of MBT buffer 29c shown in FIG. 15. As described in relation to FIG. 14, when signal PAE falls to the "L" level, signals PDCL2 and /PDCL2 both attain the "L" level. In addition, during MBT, signal ZTE is set at the "L" level. When signal RDRVM is raised to the "H" level in response to the rising edge of clock signal CLK, a signal (in this case, ZMBDRV) corresponding to one of signals PDD and ZPDD that has the "H" level (for instance, PDD) attains the "L" level, rendering P-channel MOS transistor 109 conductive, and data bus line DBL2 is raised to the "H" level.

Since P-channel MOS transistor 110 does not conduct, another data bus line /DBL2 remains unchanged at a precharge potential VDB. Other MBT buffers 29a, 29b, and 29d have the same configuration as MBT buffer 29c.

Figure 17:
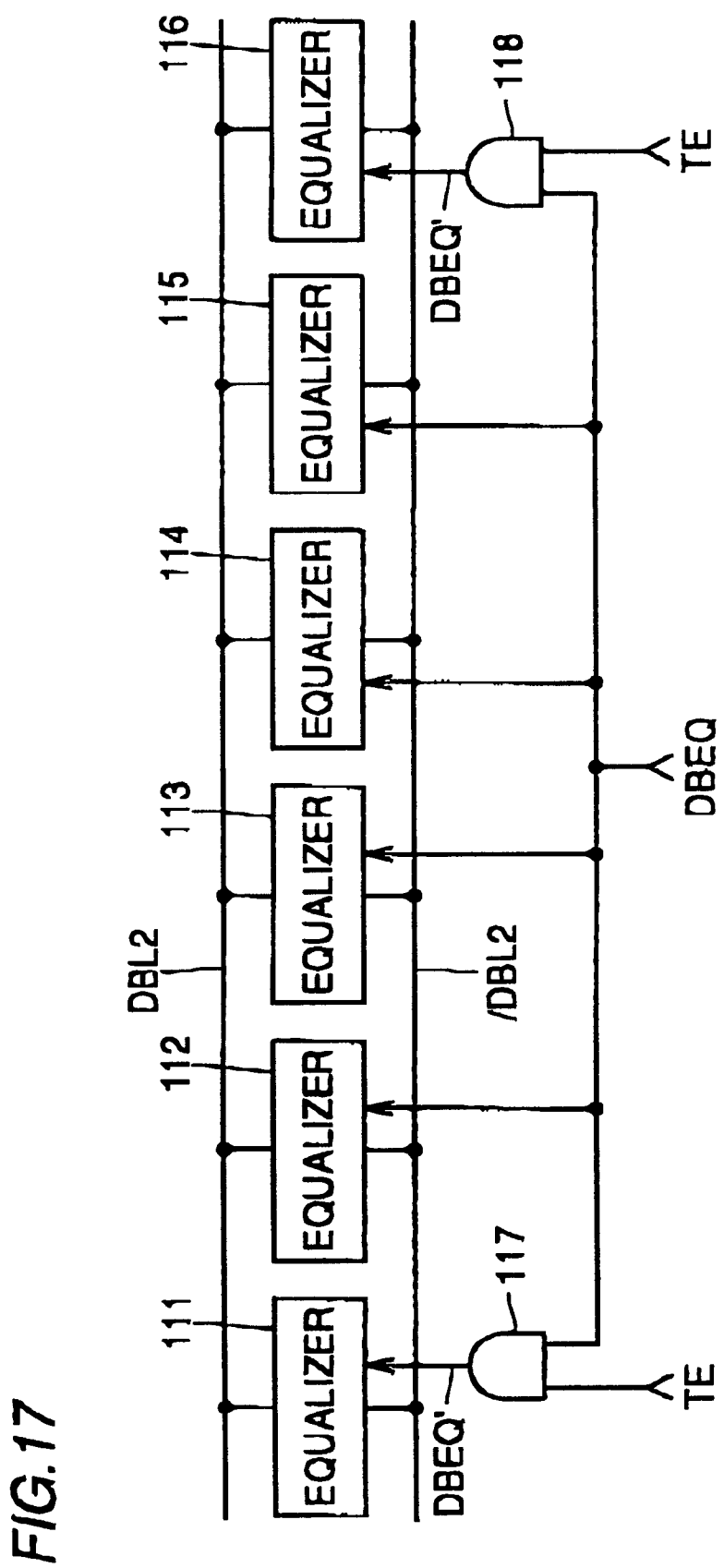
FIG. 17 is a circuit block diagram related to the description of a method of equalization of a data bus shown in FIG. 8.

FIG. 17 is a circuit block diagram showing a method of equalization of a data bus DB. The SDRAM according to the present embodiment has a large capacity and a large chip area so that interconnection line length of data bus DB is long and the capacity of data bus DB is large. As a consequence, the equalizing speed becomes disadvantageously slow if an equalizer employing a large-size transistor is disposed in one location of data bus DB1. In view of layout, it is also difficult to dispose such a large equalizer in one location.

Thus, as shown in FIG. 17, in the SDRAM a plurality of (six in FIG. 17) equalizers 111 to 116 employing transistors of a relatively small size are scatteringly provided in the direction in which each data bus DB extends. FIG. 17 shows only the portion related to data bus DB2. Signal DBEQ is directly input to equalizers 112 to 115. A logical product signal DBEQ' generated from signal TE and signal DBEQ in AND gate 117 is input to equalizer 111. A logical product signal DBEQ' generated from signal TE and signal DBEQ in AND gate 118 is input to equalizer 116. Signal TE is a signal that attains the "H" level during MBT and that attains the "L" level during a normal operation.

Figure 18:
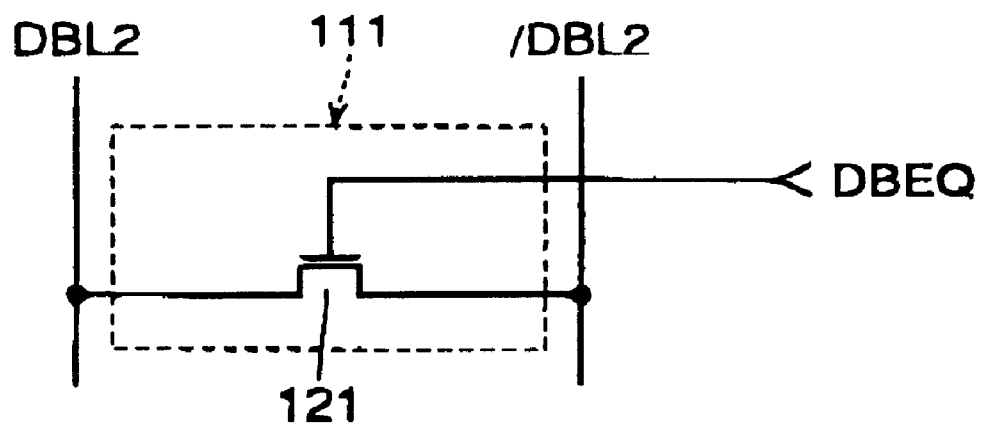
FIG. 18 is a circuit diagram showing the configuration of an equalizer 111 shown in FIG. 17.

As shown in FIG. 18, equalizer 111 includes an N-channel MOS transistor 121 connected between data bus line DBL2 and /DBL2 for receiving signal DBEQ' at a gate. During MBT, when signal DBEQ attains the "H" level and signal DBEQ' attains the "H" level or the active level, N-channel MOS transistor 121 is rendered conductive, equalizing the potentials of data bus lines DBL2 and /DBL2. Equalizers 113, 114, and 116 have the same configuration as equalizer 111, except that signal DBEQ in place of signal DBEQ' is input to equalizers 113 and 114.

Figure 19:
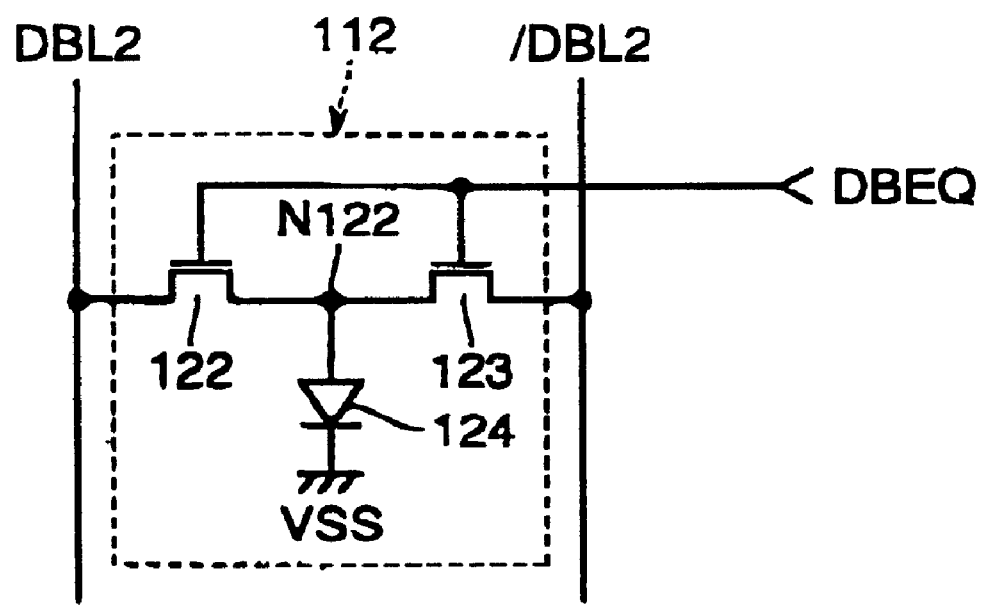
FIG. 19 is a circuit diagram showing the configuration of an equalizer 112 shown in FIG. 17.

Equalizer 112 includes N-channel MOS transistors 122 and 123 and a diode 124, as shown in FIG. 19. N-channel MOS transistors 122 and 123 are connected in series between data bus lines DBL2 and /DBL2, and receive signal DBEQ at their respective gates. Diode 124 is connected between a ground potential VSS line and a node N122 between N-channel MOS transistors 122 and 123. Equalizer 115 has the same configuration as equalizer 112.

When signal DBEQ attains the "h" level, N-channel MOS transistors 122 and 123 are rendered conductive, and the potentials of data bus lines DBL2 and /DBL2 are equalized to precharge potential VDB, i. e. a built-in potential (for instance, 0.5 V) of diode 124.

Figure 20:
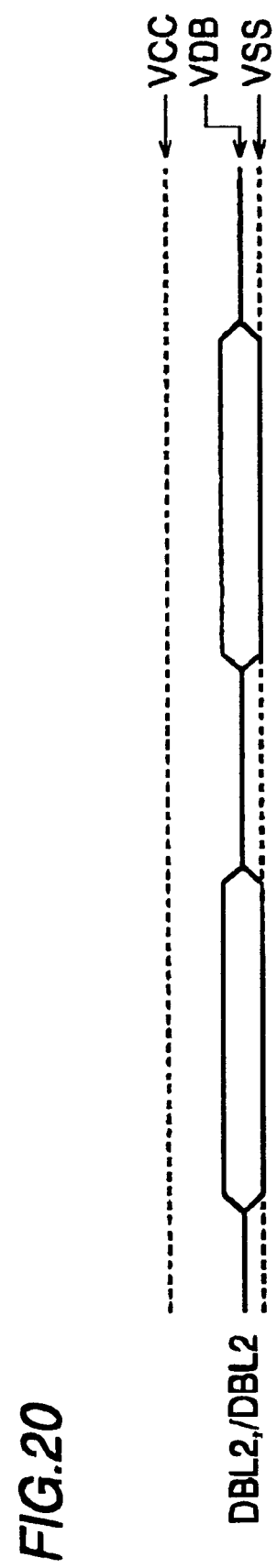
FIG. 20 is a timing chart related to the description of a method of equalization of a data bus shown in FIGS. 17 to 19.

Therefore, during the normal operation in which signal TE attains the "L" level, equalizers 112 to 115 are activated when signal DBEQ attains the "H" level, whereas during MBT operation in which signal TE attains the "H" level, equalizers 111 to 116 are activated when signal DBEQ attains the "H" level, and thereby potentials of data bus lines DBL2 and /DBL2 are equalized to precharge potential VDB, as shown in FIG. 20. After signal DBEQ falls to the "L" level and the equalization is interrupted, data bus lines DBL2 and /DBL2 are driven by RD buffer 28c. One of data bus lines DBL2 and /DBL2 is connected in a pulsed manner to a power-supply potential VCC (for instance, 3 V) line and rises to the "H" level (for instance, 1.0 V), while the other is connected in a pulsed manner to a ground potential VSS line and brought to the "L" level (0 V).

Figure 21:
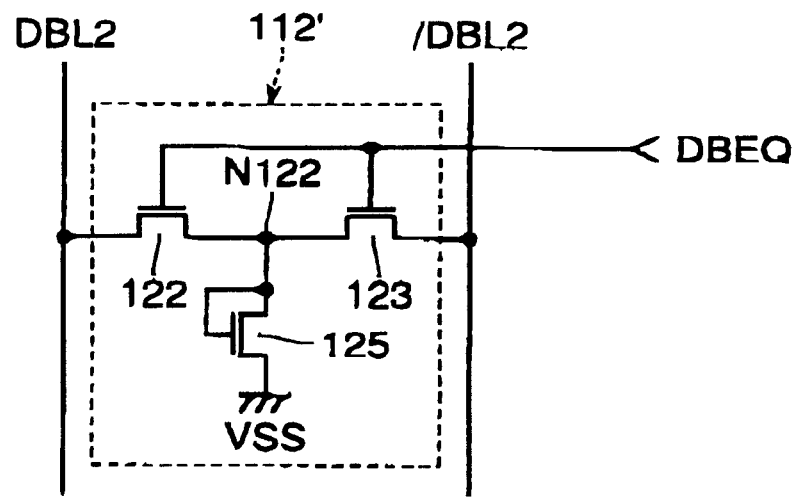
FIG. 21 is a circuit diagram showing a variation of equalizer 112 shown in FIG. 19.

As shown in FIG. 21, diode 124 can be replaced by a diode-connected N-channel MOS transistor 125. In such a case, precharge potential VDB is a threshold potential of N-channel MOS transistor 215.

Figure 22:
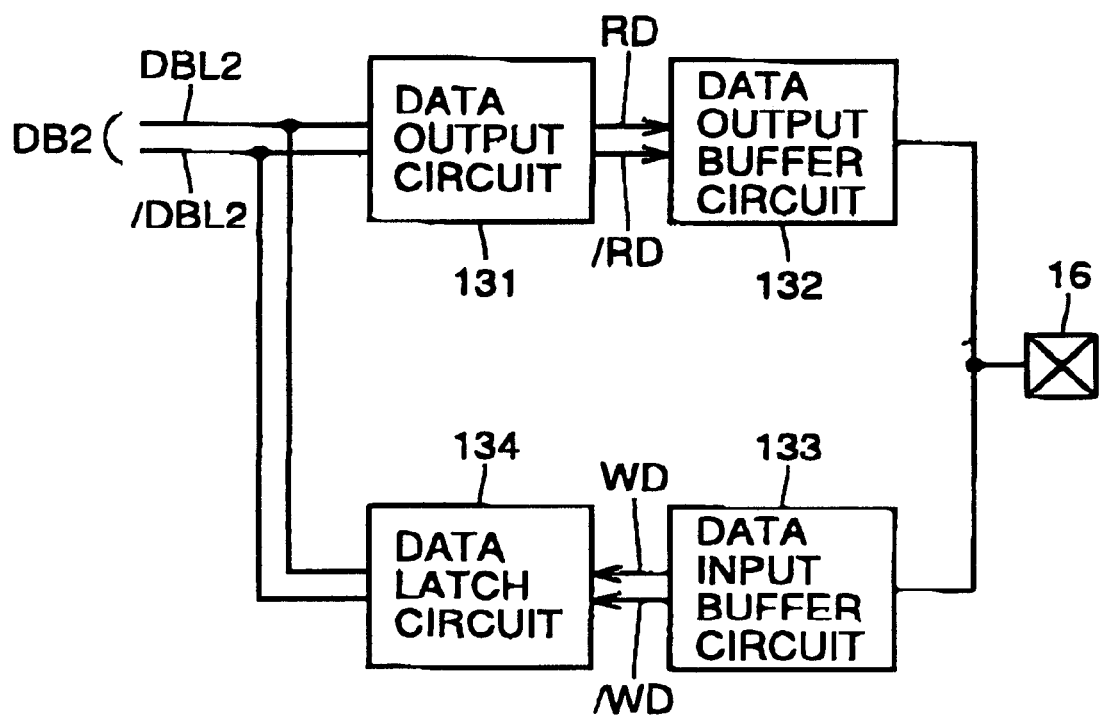
FIG. 22 is a block diagram showing the configuration of an IO buffer 8 shown in FIG. 1.

FIG. 22 is a block diagram showing a portion corresponding to data bus DB2 in an I/O buffer 8 shown in FIG. 1. As shown in FIG. 22, I/O buffer 8 includes a data output circuit 131, a data output buffer circuit 132, a data input buffer circuit 133, and a data latch circuit 134.

During a read operation, data output circuit 131 and data output buffer circuit 132 are activated. Data output circuit 131 compares the potentials of data bus lines DBL2 and /DBL2, and provides read data signals RD and /RD corresponding to the result of the comparison to data output buffer circuit 132. Data output buffer circuit 132 causes data input/output pad 16 to attain the "H" level (power-supply potential VCC) or the "L" level (ground potential VSS) in response to signals RD and /RD from data output circuit 131.

During a write operation, data input buffer circuit 133 and data latch circuit 134 are activated. Data input buffer circuit 133 detects the level ("H" level or "L" level) of the data signal provided from outside via data input/output pad 16, and provides write data signals WD and /WD corresponding to the result of the detection to data latch circuit 134. Data latch circuit 134 maintains one of data bus lines DBL2 and /DBL2 at the "H" level (power-supply potential VCC) and the other at the "L" level (ground potential VSS) according to signals WD and /WD from data input buffer circuit 133.

Figure 23:
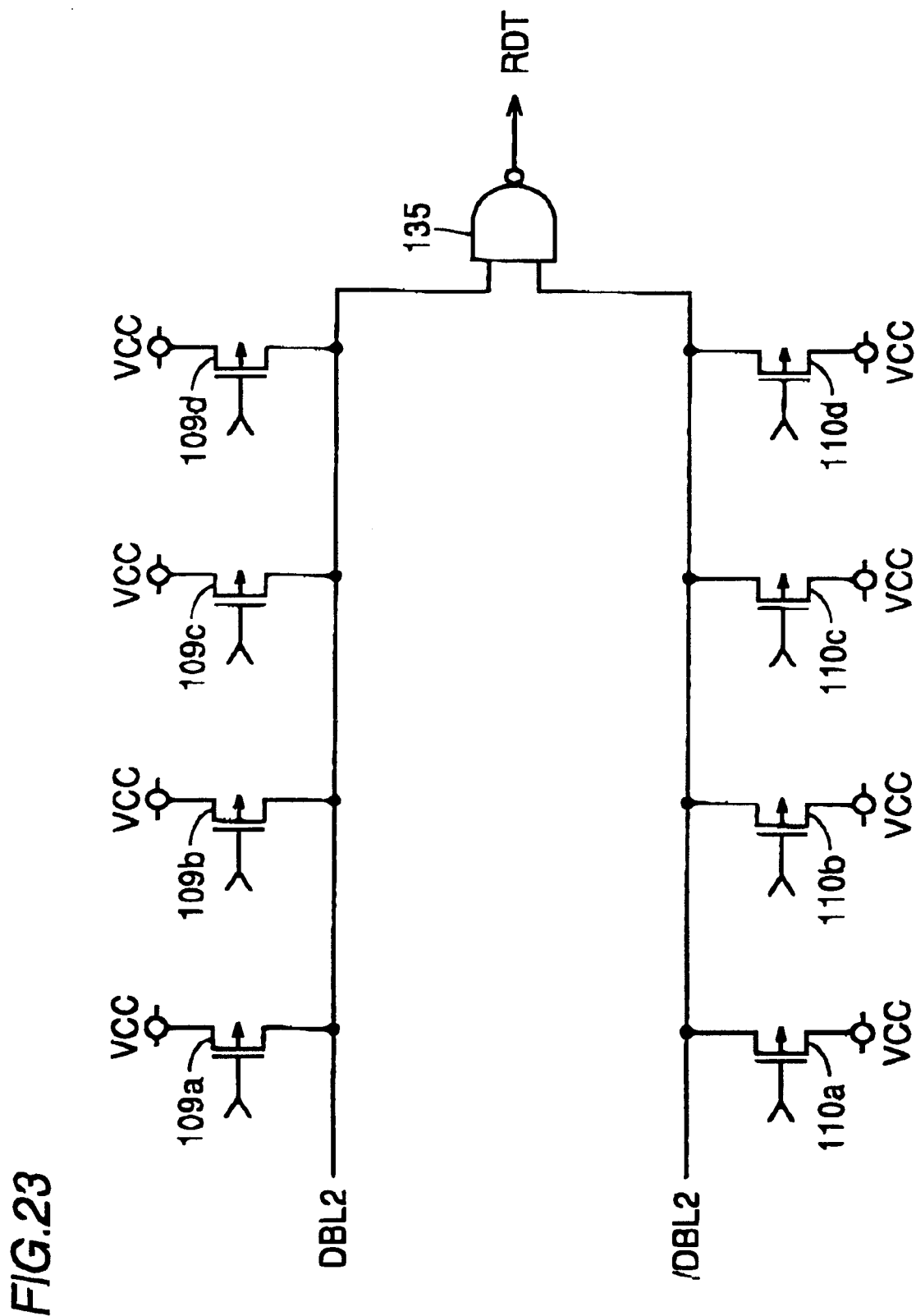
FIG. 23 is a circuit block diagram related to the description of an operation in MBT of a data output circuit shown in FIG. 22.
Figure 24:
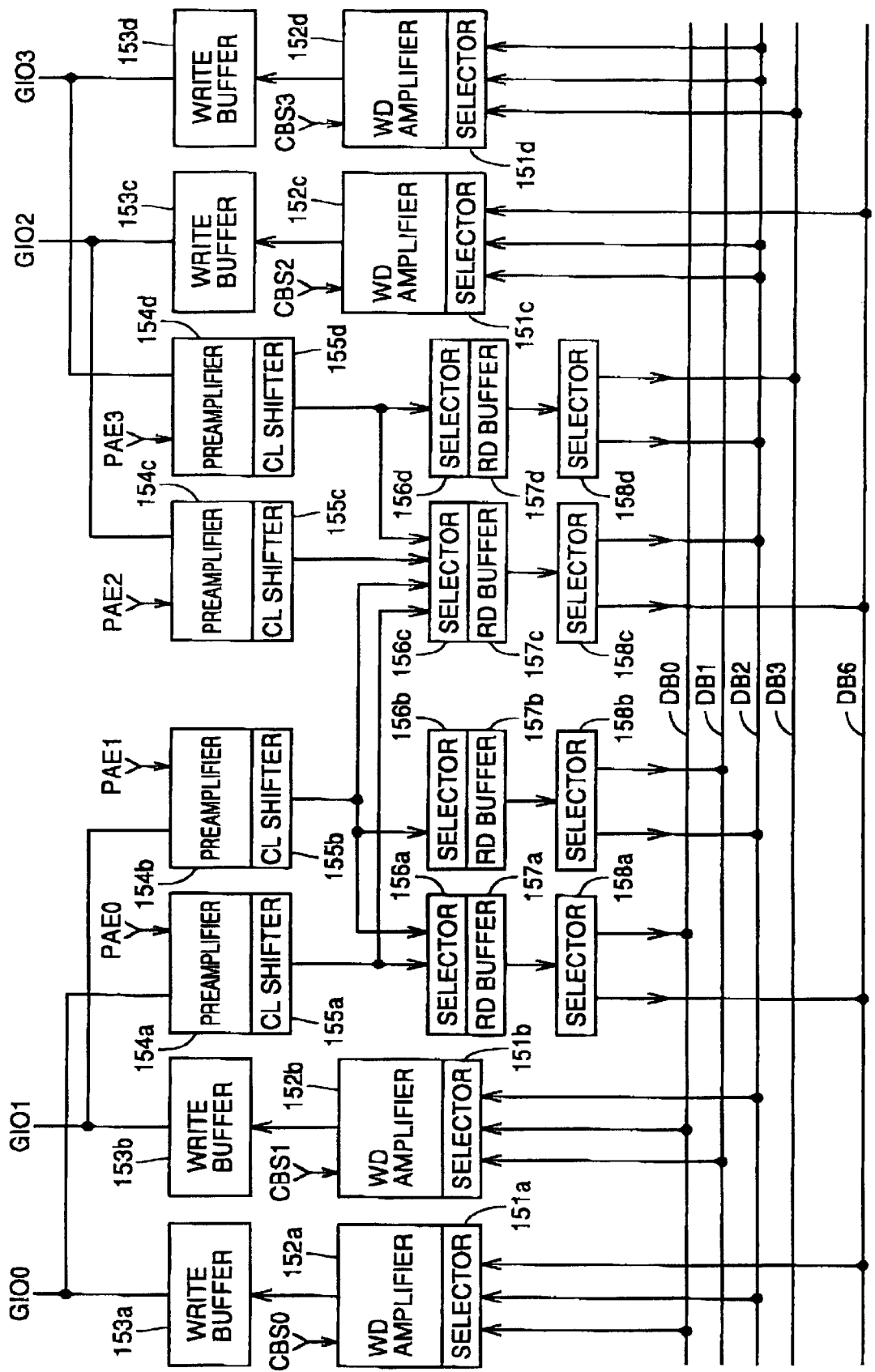
FIG. 24 is a block diagram showing a main portion of a conventional SRAM.
Figure 25:
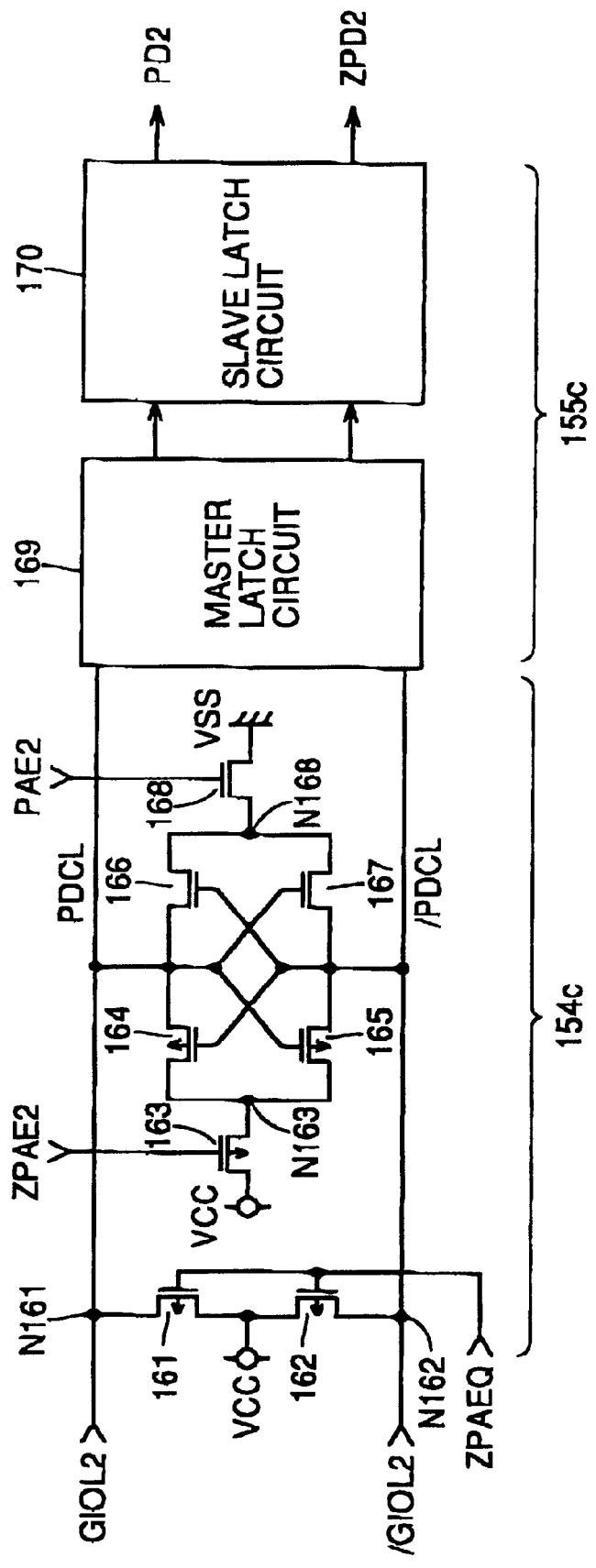
FIG. 25 is a circuit block diagram showing the configurations of preamplifier 154$c$ and CL shifter 155$c$ shown in FIG. 24.
Figure 26:
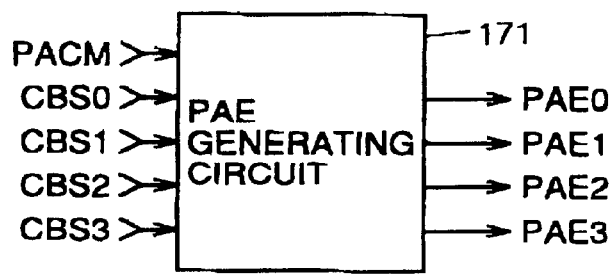
FIG. 26 is a block diagram related to the description of a method of generating signals PAE0 to PAE3 shown in FIG. 24.
Figure 27:
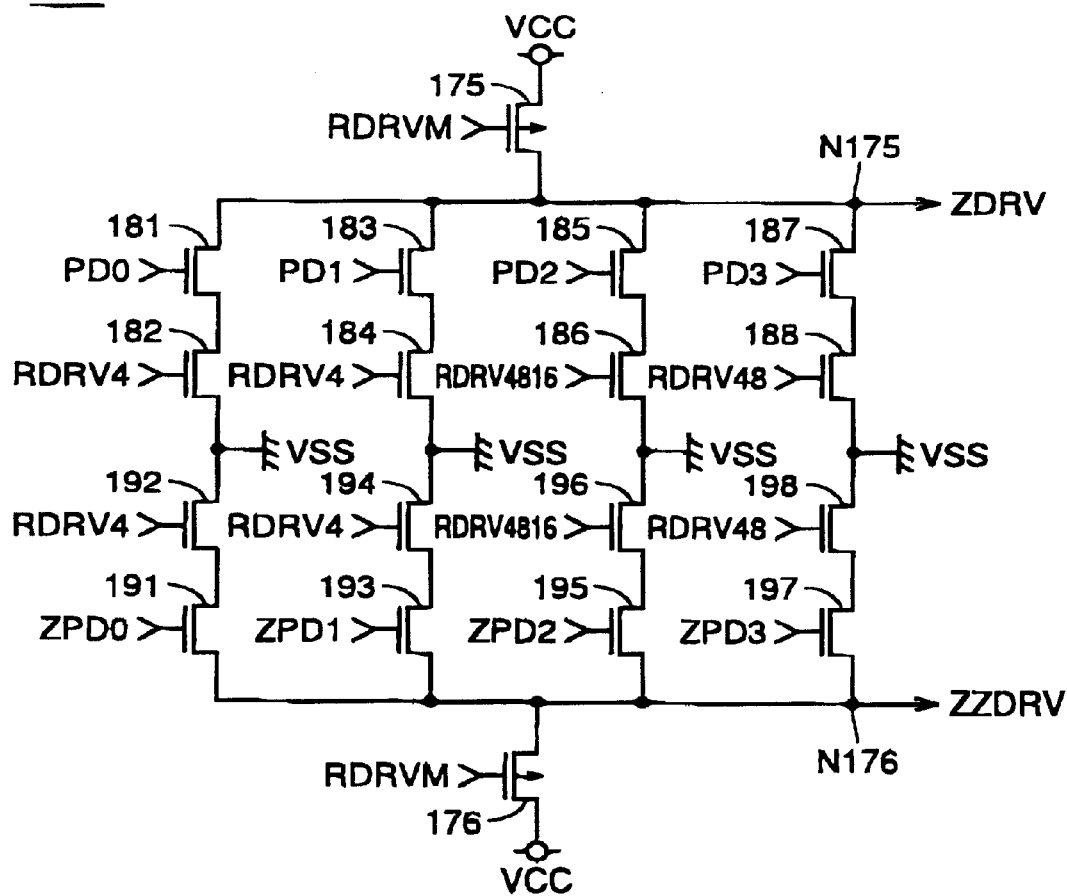
FIG. 27 is a circuit diagram showing the configuration of a selector 156$c$ shown in FIG. 24.
Figure 28:
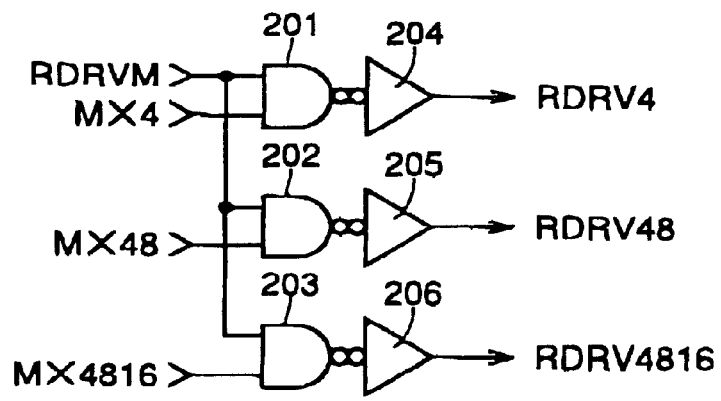
FIG. 28 is a circuit diagram related to the description of a method of generating signals RDRV4, RDRV48, and RDRV4816 shown in FIG. 27.
Figure 29:
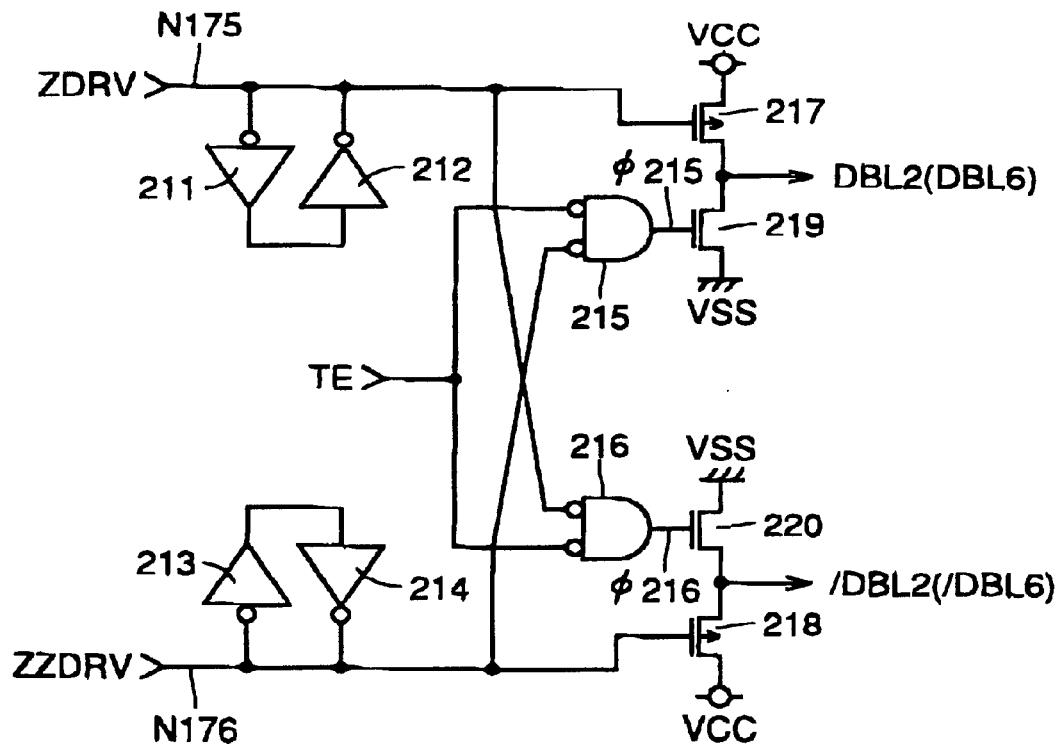
FIG. 29 is a circuit diagram showing the configuration of an RD buffer 157c shown in FIG. 24.
Figure 30:
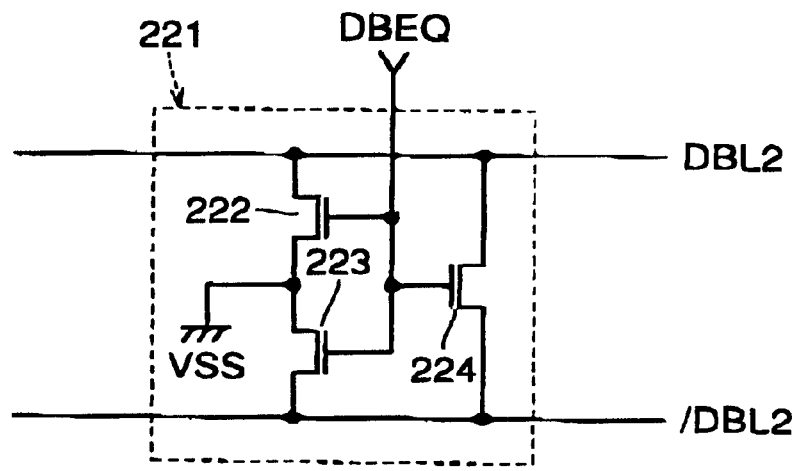
FIG. 30 is a circuit diagram showing the configuration of an equalizer for equalizing a data bus shown in FIG. 24.
Figure 31:
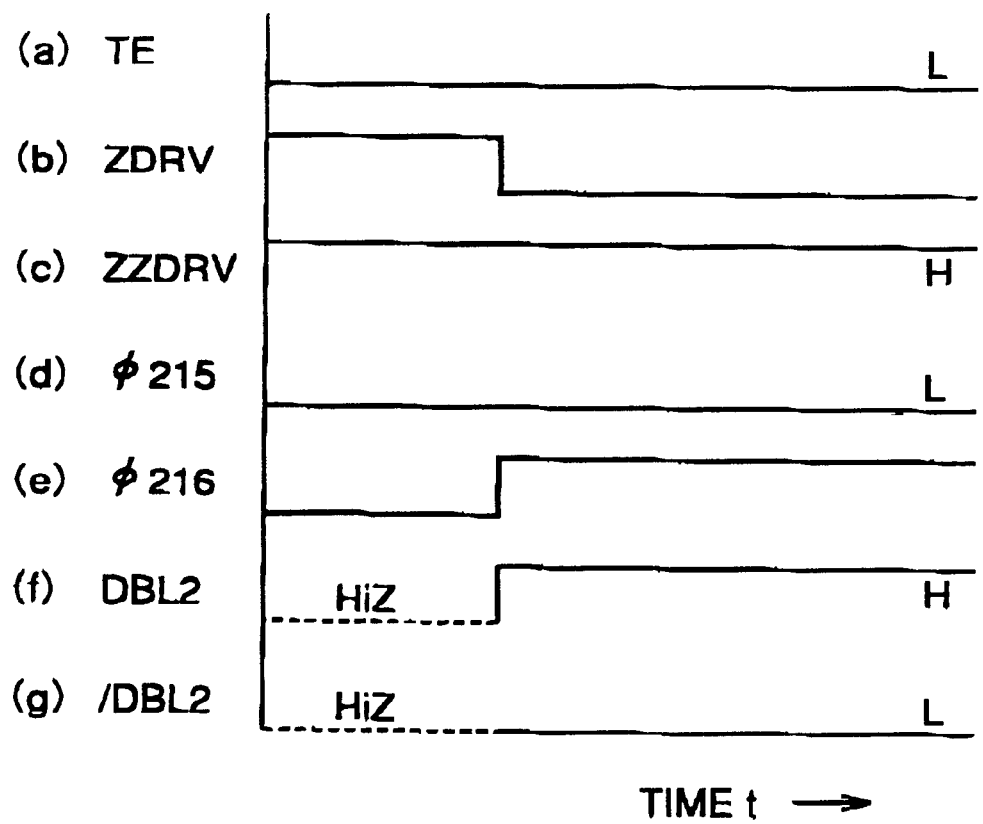
FIG. 31 is a timing chart illustrating the normal read operations of an RD buffer shown in FIG. 29 and an equalizer shown in FIG. 30.
Figure 32:
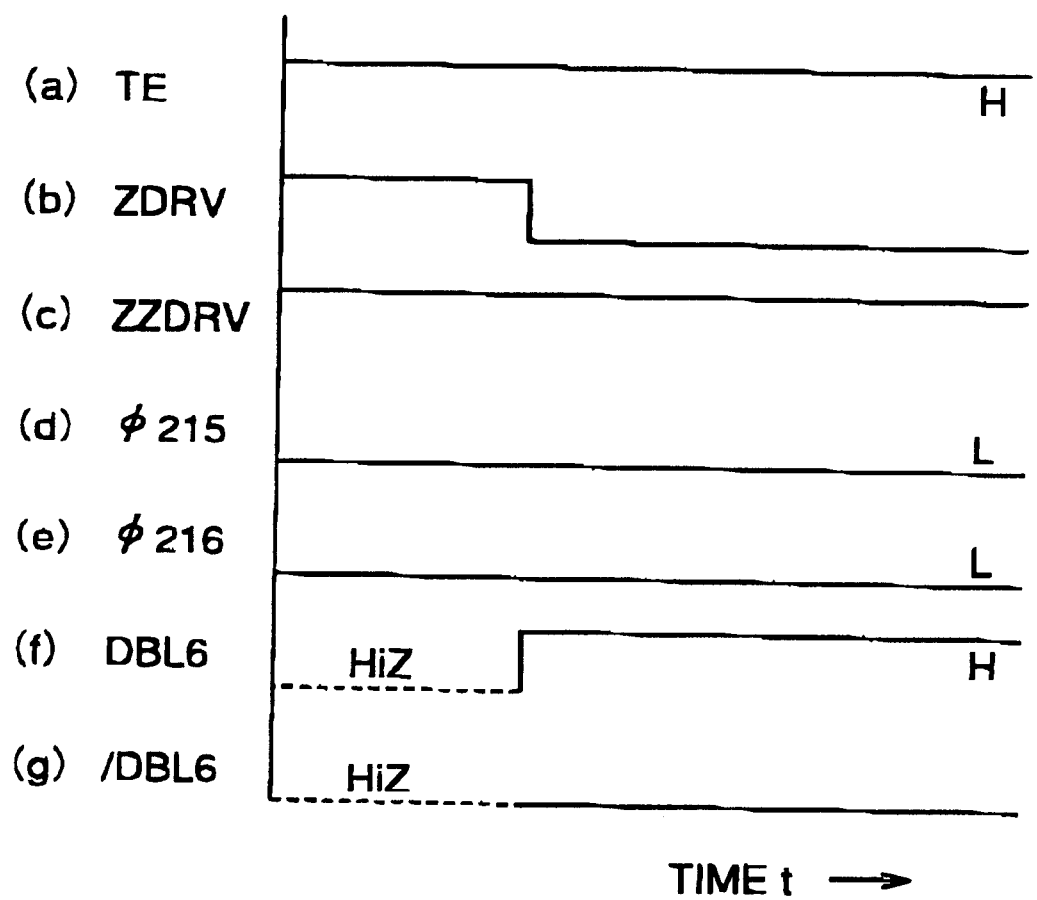
FIG. 32 is a timing chart illustrating the read operations in MBT of the RD buffer shown in FIG. 29 and the equalizer shown in FIG. 30.

In addition, as shown in FIG. 23, data output circuit 131 includes an NAND gate 135 for detecting whether 4 bits of data read out on one data bus (DB2 in FIG. 23) during a read operation in MBT match or not. Since the same data are written into each of four memory cells MC from one data bus DB2 during the write operation in MBT, the four memory cells MC are normal if the same data are read from the four memory cells MC. If, however, different data is read out from at least one of the four memory cells MC, at least one of the four memory cells MC is defective. Thus, the normalcy of the four memory cells can be determined by detecting whether 4 bits of data read out from the four memory cells MC match or not.

Figure 16:
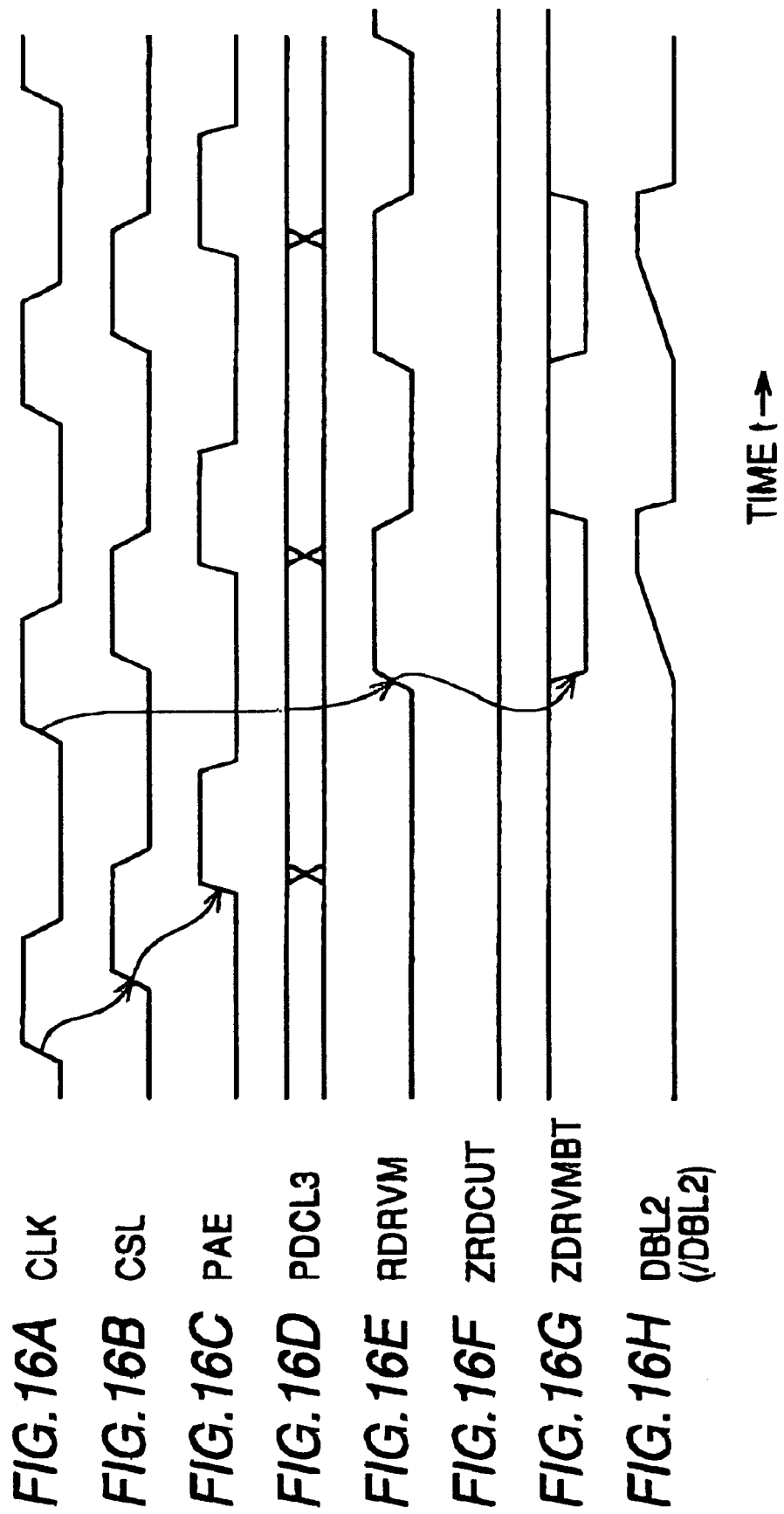
FIGS. 16A to 16H are timing charts illustrating the operation of MBT buffer 29$c$ shown in FIG. 15.

P-channel MOS transistors 109a to 109d and 110a to 110d in FIG. 23 correspond to P-channel MOS transistors 109 and 110 of MBT buffer 29c shown in FIG. 16. P-channel MOS transistors 109a and 110a are contained in MBT buffer 29b of FIG. 8, and P-channel MOS transistors 109b and 110b are contained in MBT buffer 29d. P-channel MOS transistors 109c and 110c are contained in MBT buffer 29b corresponding to memory mat MM1b shown in FIG. 2, and P-channel MOS transistors 109d and 110d are contained in MBT buffer 29d corresponding to memory mat MM1b. NAND gate 135 receives the signals appearing on data bus lines DBL2 and /DBL2, and outputs a signal RDT.

If the read data from four memory cells MC match, of P-channel MOS transistors 109a to 109d and 110a to 110d, only P-channel MOS transistors 109a to 109d are rendered conductive, causing only data bus line DBL2 of data bus lines DBL2 and /DBL2 to attain the "H" level, or only P-channel MOS transistors 110a to 110d are rendered conductive, causing only data bus line /DBL2 of data bus lines DBL2 and /DBL2 to attain the "H" level, so that signal RDT attains the "H" level.

If the read data from four memory cells MC does not match, at least one P-channel MOS transistor (for instance, 109a) of P-channel MOS transistors 109a to 109d and the remaining P-channel MOS transistors (in this case, 110b to 110d) of P-channel MOS transistors 110a to 110d are rendered conductive, causing both data bus lines DBL2 and /DBL2 to attain the "H" level so that signal RDT attains the "L" level.

Data output circuit 131 applies read data signals RD and /RD corresponding to signal RDT to data output buffer circuit 132, and data output buffer circuit 132 outputs a signal of the level corresponding to the signals RD and /RD to data input/output pad 16. Thus, the normalcy of the four memory cells MC can be determined by detecting the level of data input/output pad 16.

According to the present embodiment, selectors 24a to 24d are provided between global IO line pairs GIO0 to GIO3 and preamplifiers 25a to 25d so that interconnections and layout can be simplified and the layout area can be reduced in comparison with the conventional example in which selectors 156a to 156d are provided between CL shifters 155a to 155d and RD buffers 157a to 157b.

Moreover, since global IO line pairs GIO0 to GIO3 and input/output node pair N31 and N32 of preamplifiers 25a to 25d are connected in a pulsed manner by selectors 24a to 24d, the equalization of global IO line pairs GIO0 to GIO3 and the equalization of input/output node pair N31 and N32 of preamplifiers 25a to 25d can be effected separately. Thus, longer equalization period can be set aside for global IO line pairs GIO0 to GIO3 having a large capacity so that the read operation can be stabilized.

Furthermore, RD buffers 28a to 28d provide a power-supply potential VCC or a ground potential VSS in a pulsed manner to each of data bus lines DBL and /DBL, and bring each of data bus lines DBL and /DBL to 1 V or 0 V. Consequently, the consumed current can be kept small in comparison with the conventional example in which each of data bus lines DBL and /DBL are brought to a power-supply potential VCC (for instance, 3 V) or a ground potential VSS (0 V).

In addition, signal RDRVM is delayed and inverted by NAND gates 90 and 91 and inverters 92 to 94 to generate signal ZRDCUT, and power-supply potential VCC or a ground potential VSS is provided to each of data bus lines DBL and /DBL while signals RDRVM and ZRDCUT are both at the "H" level. Thus, the lowering of power-supply potential VCC increases the delay time of NAND gate 90 and 91 and inverters 92 and 94 so that the potential amplitudes of data bus lines DBL and /DBL are kept from becoming smaller when power-supply potential VCC is lowered.

Moreover, since an SDRAM is connected to a tester in a test mode, and its current consumption and operational speed are of no concern, the testing operation is stabilized by MBT buffers 29a to 29d applying a power-supply potential VCC or a ground potential VSS to data bus lines DBL and /DBL.

Furthermore, a plurality of equalizers 111 to 116 are scatteringly provided in the direction in which a data bus DB extends so that data bus DB can be equalized at a high speed.

In addition, during an equalization period, equalizers 112 and 115 connect data bus lines DBL and /DBL to an anode of diode 124 and bring each of data bus lines DBL and /DBL to a built-in potential of diode 124 so that a precharging power source is not required.

Moreover, although the potential amplitudes of data bus lines DBL and /DBL are larger during MBT than during a normal operation, the equalization tine for MBT and for the normal operation can be made the same by activating equalizers 112 to 115 during the normal operation and activating equalizers 111 to 116 during MBT.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A semiconductor memory device comprising:
   a memory array including a plurality of memory cells disposed in a plurality of rows and a plurality of columns, a plurality of word lines respectively provided corresponding to said plurality of rows, and a plurality of bit line pairs respectively provided corresponding to said plurality of columns;

a sense amplifier provided corresponding to each of the bit line pairs for amplifying a potential difference produced between a corresponding bit line pair;

a data transmission line pair provided in common to said plurality of bit line pairs;

a row select circuit for selecting one of said plurality of word lines according to a row address signal, causing the selected word line to attain a select level to activate each of memory cells corresponding to the selected word line, and producing the potential difference between each bit line pair;

a column select circuit for selecting one of said plurality of bit line pairs according to a column address signal and providing the potential difference between the selected bit line pair to said data transmission line pair;

a preamplifier for amplifying the potential difference provided to its input/output node pair;

a switching element pair connected between said data transmission line pair and the input/output node pair of said preamplifier and rendered conductive in a pulsed manner for a prescribed period of time to provide the potential difference produced between said data transmission line pair to the input/output node pair of said preamplifier; and a transmission circuit for transmitting an output signal of said preamplifier to outside.

2. A semiconductor memory device provided with a memory array containing a plurality of memory cells comprising:

a data transmission line pair which is provided with a potential difference corresponding to data read out from a selected memory cell of said plurality of memory cells;

a preamplifier for amplifying a potential difference provided to its input/output node pair;

a switching element pair connected between said data transmission line pair and the input/output node pair of said preamplifier and rendered conductive in a pulsed manner for a prescribed period of time to provide a potential difference produced between said data transmission line pair to the input/output node pair of said preamplifier;

a transmission circuit for transmitting an output signal of said preamplifier to outside;

a first equalizer for equalizing potentials of said data transmission line pair to a prescribed precharge potential during a first equalization period after said switching element pair is rendered conductive in a pulsed manner and turned off; and a second equalizer for equalizing potentials of the input/output node pair of said preamplifier to said prescribed precharge potential during a second equalization period before said switching element pair is rendered conductive in a pulsed manner.

3. A semiconductor memory device provided with a memory array containing a plurality of memory cells comprising:

a data transmission line pair which is provided with a potential difference corresponding to data read out from a selected memory cell of said plurality of memory cells;

a preamplifier for amplifying a potential difference provided to its input/output node pair;

a switching element pair connected between said data transmission line pair and the input/output node pair of said preamplifier and rendered conductive in a pulsed manner for a prescribed period of time to provide a potential difference produced between said data transmission line pair to the input/output node pair of said preamplifier;

a transmission circuit for transmitting an output signal of said preamplifier to outside;

wherein said data transmission line pair and said switching element pair are provided in plurality;

said semiconductor memory device further comprising a selecting circuit for selecting one of a plurality of said data transmission line pairs according to an address signal and for rendering conductive in a pulsed manner a switching element pair corresponding to selected data transmission line for said prescribed period of time.

4. The semiconductor memory device according to claim 3, further comprising:

a first equalizer for equalizing potentials of each said data transmission line pair to a prescribed precharge potential during a first equalization period after said data transmission line pair and the input/output node pair of said preamplifier are connected in a pulsed manner and disconnected from each other; and a second equalizer for equalizing potentials of the input/output node pair of said preamplifier to a precharge potential during a second equalization period before said data transmission line pair and the input/output node pair of said preamplifier are connected in a pulsed manner.

5. A semiconductor memory device which is provided with a plurality of memory cells, and which has a first read mode for simultaneously outputting data signals of N-bits (N is an integer not less than 2) and a second read mode for simultaneously outputting data signals of M-bits (M is an integer smaller than N), comprising:

N data transmission line pairs, each provided a potential difference corresponding to data read out from a selected memory cell of said plurality of memory cells;

N preamplifiers, each for amplifying a potential difference provided to its input/output node pair;

a selector for respectively connecting said N data transmission line pairs with input/output node pairs of said N preamplifiers in said first read mode, and for selecting M data transmission line pairs out of said N data transmission line pairs according to an address signal and connecting selected M data transmission line pairs respectively to input/output node pairs of pre-selected M preamplifiers in said second read mode; and transmission circuits provided corresponding to respective preamplifiers for transmitting output data signals of corresponding preamplifiers.

6. The semiconductor memory device according to claim 5, further having a test mode for testing each memory cell for normalcy, wherein said selector respectively connects said N data transmission line pairs to input/output node pairs of said N preamplifiers in said test mode, said semiconductor memory device further comprising:

a determination circuit for determining whether output data signals of predetermined number of said N preamplifiers match in logic, and for outputting a signal indicating normalcy of selected memory cells in said predetermined number when a match occurs and outputting a signal indicating at least one memory cell of the selected memory cells as being defective when no match occurs.

* * * * *